(12) United States Patent
Gorisse

(10) Patent No.: US 8,928,509 B2
(45) Date of Patent: Jan. 6, 2015

(54) INCOMING SIGNAL SAMPLING DEVICE

(71) Applicant: Thales Holdings UK Plc, Surrey (GB)

(72) Inventor: Benoit Gorisse, West Sussex (GB)

(73) Assignee: Thales Holdings UK PLC (GB)

( * ) Notice: Subject to any disclaimer, the term of this patent is extended or adjusted under 35 U.S.C. 154(b) by 0 days.

(21) Appl. No.: 14/059,980

(22) Filed: Oct. 22, 2013

(65) Prior Publication Data

US 2014/0119412 A1     May 1, 2014

(30) Foreign Application Priority Data

Oct. 29, 2012    (GB) .................................. 1219424.7

(51) Int. Cl.
| | |
|---|---|
| *H03M 1/00* | (2006.01) |
| *H04B 7/17* | (2006.01) |
| *H03D 7/00* | (2006.01) |
| *H03D 3/00* | (2006.01) |
| *H04L 25/24* | (2006.01) |

(52) U.S. Cl.
CPC .. *H04B 7/17* (2013.01); *H03D 7/00* (2013.01); *H03D 3/006* (2013.01); *H04L 25/24* (2013.01); *H03D 2200/006* (2013.01)
USPC ............................ 341/123; 341/155; 375/238

(58) Field of Classification Search
CPC ..... H03M 1/124; H03M 1/128; H03M 1/127; H03H 17/0416; H03H 17/0621
USPC .................... 341/122, 144, 155; 375/238, 239
See application file for complete search history.

(56) References Cited

U.S. PATENT DOCUMENTS

| | | | | |
|---|---|---|---|---|
| 3,808,591 | A * | 4/1974 | Panicello et al. | 340/945 |
| 4,450,444 | A * | 5/1984 | Wehner et al. | 342/25 F |
| 4,763,347 | A * | 8/1988 | Erdman | 318/400.22 |
| 4,833,474 | A * | 5/1989 | Nagai et al. | 341/166 |
| 6,259,731 | B1 * | 7/2001 | Dent et al. | 375/239 |
| 6,314,127 | B1 * | 11/2001 | Lynch et al. | 375/144 |
| 6,650,264 | B1 | 11/2003 | Chan et al. | |
| 8,737,554 | B2 * | 5/2014 | Kim et al. | 375/371 |
| 2007/0081578 | A1 | 4/2007 | Fudge et al. | |
| 2012/0039417 | A1 | 2/2012 | Kim et al. | |
| 2013/0321053 | A1 * | 12/2013 | Bogner et al. | 327/261 |

FOREIGN PATENT DOCUMENTS

WO     2011128881     10/2011

OTHER PUBLICATIONS

Search and Examination Report for GB1219424.7 dated Jan. 10, 2013.
Sparse signal sensing with non-uniform undersampling and frequency excision by Andrew Brourdoux et al. Cognitive Radio Oriented Wireless Networks and Communications, 2011 Sixth International ICST Conference on Jun. 1, 2011.
Non-uniform Sampling Schemes for RF Bandpass Sampling Reciever, Bechir, D.M. et al., 2009 International Conference on Signal Processing Systems, May 15, 2009, IEEE, Piscataway, NJ, USA.

(Continued)

*Primary Examiner* — Peguy Jean Pierre
(74) *Attorney, Agent, or Firm* — Snell & Wilmer L.L.P.

(57) ABSTRACT

A sampling device for sampling an incoming signal in order to generate an output signal having a different frequency spectrum from the incoming signal. The device comprises a sampler configured to sample the incoming signal at a series of intervals in time, wherein the series of intervals includes a temporally repeating sequence of intervals, and wherein the duration of successive intervals varies throughout the series.

20 Claims, 26 Drawing Sheets

(56) References Cited

OTHER PUBLICATIONS

A Nyquist folding analog-to-information reciever. Fudge, G.L., et al. Signals, Systems and Computers, 2008 42nd Asilomar Conference on Oct. 26, 2008, IEEE, Piscataway, NJ, USA.

Andre Bourdoux et al,: "Sparse signal sensing with non-uniform undersampling and frequency excision," Cognitive Radio Oriented Wireless Networks and Communications, 2011 Sixth International ICST Conference ON, IEEE, Jun. 1, 2011, pp. 246-250.

Bechir D M et al: "Non-uniform Sampling Schemes for RF Bandpass Sampling Reciever" 2009 International Conference on Signal Processing Systems, IEEE, Piscataway, NJ, May 15, 2009, pp. 13-17.

Fudge G L et al: "A Nyquist folding analog-to-information reciever", Signals, Systems and Computers, 2008 42nd Asilomar Conference ON, IEEE, Piscataway, NJ, Oct. 26, 2008, pp. 541-545.

\* cited by examiner

A Sampling of the input radio frequency wave in sampling windows $T_S$

B Description of the pulses used to form a sample in each window

C Pulse train in the time domain

D Pulse train in the frequency domain

E Envelope of pulse train in the frequency domain

INCOMING SIGNAL SAMPLING DEVICE

RELATED APPLICATIONS

This application claims the benefit of and priority to U.K. application No. 1219424.7 filed on Oct. 29, 2012 and entitled, "Sampling Device," which is hereby incorporated by reference in its entirety.

FIELD OF THE INVENTION

Embodiments described herein relate to a sampling device.

BACKGROUND

Electronic Attack (EA) and Electronic Support Measures (ESM) systems require large bandwidth capabilities. In other words, such systems should be capable of processing a broad range of frequency components from an input signal. Heterodyne architectures are not well adapted to this requirement, limiting the instantaneous bandwidth. Sampling systems, by contrast, overcome this limitation and have shown good performance for low to medium frequencies. However, frequency conversion of high frequencies by sampling still remains challenging. The upper frequency limit of sampling systems depends on the signal fidelity required. For ESM systems this is typically about 10 to 20 GHz.

In particular, problems may arise due to incompatibilities between the band pass characteristics of a typical system of interest and those of the system that is used to actually sample the incoming or outgoing signal. In current systems, in order to process the incoming/outgoing signal with high fidelity, it is necessary to split the spectrum, by the use of analogue filters, into different frequency bands, which are processed separately. Each of these bands has lower and upper frequency limits.

Conventional sampling systems are inherently low-pass systems, having an input bandwidth that extends from 0 to an upper limit. Increasing the upper limit of the sampler reduces the signal fidelity and therefore samplers only achieve limited signal fidelity in the high frequency bands.

Thus, there is a need to provide a band pass sampling device having an improved performance for a given input bandwidth.

SUMMARY OF THE INVENTION

According to a first embodiment, there is provided a sampling device for sampling an incoming signal in order to generate an output signal having a different frequency spectrum from the incoming signal, the device comprising a sampler configured to sample the incoming signal at a series of intervals in time, wherein the series of intervals includes a temporally repeating sequence of intervals, and wherein the duration of successive intervals varies throughout the series.

The intervals may be constant throughout the repeating sequence of intervals.

The sampling device may comprise a sample pulse generator configured to generate a sampling signal comprising a plurality of sampling pulses for activating the sampler. Each sampling pulse may have the same duration. For example, the full-width at half maximum of each sampling pulse may be constant.

The sampling device may comprise a signal splitter for splitting the incoming signal into two or more signal paths, each path comprising a respective sampler for sampling the signal as it propagates along the respective path. At least one of the signal paths may include a variable delay for delaying the propagation of the signal along that path with respect to the other paths. The device may further include a signal combiner for combining the output of each sampler into a single output path. The variable delay may be operable to delay the propagation of the signal after it has been sampled. Alternatively, the variable delay may be operable to delay the propagation of the signal prior to its being sampled.

The sample pulse generator may include an input for receiving a clock signal.

In some embodiments, generating the sampling signal may comprise generating a respective sampling pulse for activating each sampler on receipt of a signal from the clock. The sample pulse generator may comprise a variable delay for varying the delay between the sampling pulses that are output to each signal path.

In some embodiments, the sampling signal may be a stream of pulses comprising a repeating temporal sequence of pulses. The interval between successive sampling pulses may vary throughout the stream. The sample pulse generator may be configured to generate the sequence of pulses each time it receives a signal from the clock. [0013] The sample pulse generator may comprise a variable delay for varying the interval between successive sampling pulses in the repeating sequence of pulses.

The sample pulse generator may comprise a pulse generator and a pulse repeater for replicating an initial pulse output by the pulse generator.

The pulse repeater may comprise a signal splitter for splitting the initial pulse output by the pulse generator into a plurality of pulses, each pulse being used to activate the sampler.

The pulse repeater may comprise a filter.

The sample pulse generator may comprise a local oscillator for generating the repeating sequence of pulses and a pulse generator for activating and deactivating the signal output by the local oscillator. The sample pulse generator may further comprise a logic gate for receiving the output of the pulse generator and the local oscillator, the logic gate being configured to transmit the signal from the local oscillator to the sampler depending on whether the pulse generator output is above or below a threshold.

The device may comprise an analogue to digital converter for converting the output signal from an analogue signal to a digital signal. The device may comprise a phase shifter for synchronising the phase of the analogue to digital converter with a clock signal that is used to activate the sample pulse generator.

The device may comprise a digital to analogue converter for converting the input signal from a digital signal to an analogue signal. The device may comprise a phase shifter for synchronising the phase of the digital to analogue converter with a clock signal that is used to activate the sample pulse generator.

The sample pulse generator may be configured to generate sampling pulses at frequencies in excess of 1.0 GHz.

In embodiments described herein, the sampler is configured to sample the incoming signal at a series of intervals in the signal's progression. The series of intervals includes a temporally repeating sequence of intervals, and the duration of successive intervals varies throughout the series. As a result, the incoming signal is sampled at varying intervals that repeat over time. Sampling the input signal in this way means that certain frequencies of the input signal are amplified, whilst others are attenuated. Moreover, by varying the intervals between samples (and hence their relative phase) it is possible to change the frequencies that are amplified or attenuated. In this way, the sampling device can function as a tunable filter. Such functionality is desirable, because tunable filters are a main capability gap of conventional sampling systems; existing solutions are too slow and do not match the requirements for size, weight and power consumption of electronic attack and support systems used on airborne platforms, for example. Existing technologies are either very slow (such as those based on Yttrium Iron Garnet filters) or have high losses (such as varactor-tuned filters). In contrast, in embodiments described herein, the sampling device can provide these advantages with only minor changes to existing systems; since the sampling device can form part of the digitisation process, it offers a high degree of integration and can be readily implemented in existing systems.

It follows that such a sampling device can help to simplify the architecture of existing systems. When using a sampling device according to embodiments described herein, it may no longer be necessary to include a separate filter before the sampler (or after the sampler if the sampler is being used for up-conversion). In some applications, a separate filter may still be used in conjunction with the sampling device, but such a filter can still be simplified compared to that required when using a conventional sampling system.

Embodiments described herein can help to improve the sampler performance within a given band of frequencies and reduce the amplitude of unwanted frequency components in the output signal. In particular, embodiments can help to increase the relative signal power within the bandwidth of interest, whilst reducing the signal power outside of this bandwidth.

Such a sampling device is applicable to cases where the input signal is an electrical (e.g. voltage) signal, or an optical signal. The signals used for the clock signal and the sample pulses may similarly be either electrical or optical signals.

Such a sampling device can also be used for frequency ambiguity resolution. Resolving the frequency ambiguity is a major challenge in sub-Nyquist sampling systems (in the present case, this only applies where the sampling device is used for down-conversion of the incoming signal). In Nyquist conditions, the sampling frequency is at least two times the highest signal frequency and there is no ambiguity; the input signal is completely defined by its samples (Shannon sampling theorem). This result can be extended to any Nyquist band; with some restrictions on the centre frequency, a bandwidth of up to half the sampling frequency can be unambiguous. However, for input bandwidths covering more than one Nyquist band, the sampled signal is ambiguous as the knowledge of the original Nyquist zone is lost.

In the last two decades many studies have proposed solutions to resolve the frequency ambiguity, assuming the input signal is sparse in some projection basis. Some of them use different channels to collect information about the input frequency of the signal. In the present instance, the amplitude variation of the frequency components in the output signal provides information on the input frequency of the signal. Therefore, by using multiple channels with different filtering effects, it may be possible to resolve the frequency ambiguity.

BRIEF DESCRIPTION OF FIGURES

Embodiments will now be described by way of example with reference to the accompanying drawings in which.

DETAILED DESCRIPTION

Figure 1:
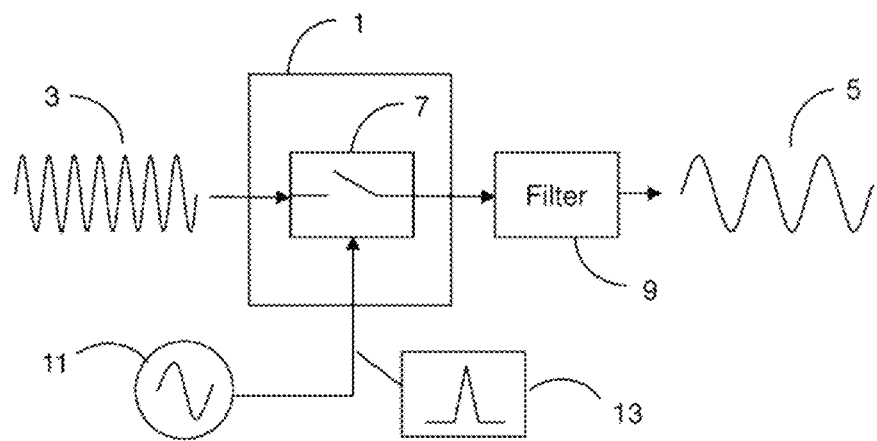
FIG. 1 shows a conventional sampling device.

FIG. 1 shows a schematic of a conventional sampling device 1. The device is used to sample an input radio frequency signal 3 in order to generate an output signal 5 having a different frequency spectrum from that of the input signal.

The input signal is sampled by closing a switch 7. The switch may be any one of a number of conventional sampling switches that can be used to connect an input signal to an output for a finite period of time. The sampled signal passes through a filter 9 and may be output to an analogue to digital converter (ADC), for example, where the signal amplitude can be measured and the signal digitised.

A clock signal generator 11 provides a stream of pulses 13 that are used to operate (close) the switch. The switch remains closed for the duration of each pulse. The interval between successive clock pulses defines a window in which the signal may be sampled by closing the switch. The sampling frequency is determined by the interval between each pulse from the clock signal generator.

Figure 2:
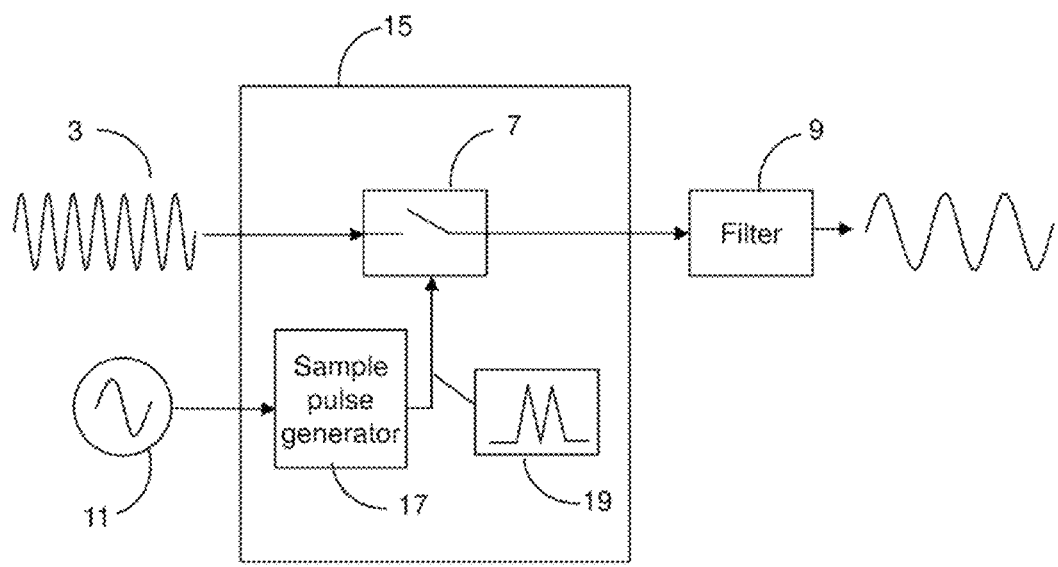
FIG. 2 shows a schematic of a sampling device according to a described embodiment.

FIG. 2 shows a schematic of a sampling device 15 according to a first embodiment. The device includes a switch 7 for sampling an incoming signal, and a sample pulse generator 17 that generates pulses 19 for activating the switch. The sample pulse generator 17 is itself activated by signals received from a clock signal generator 11.

Figure 3:
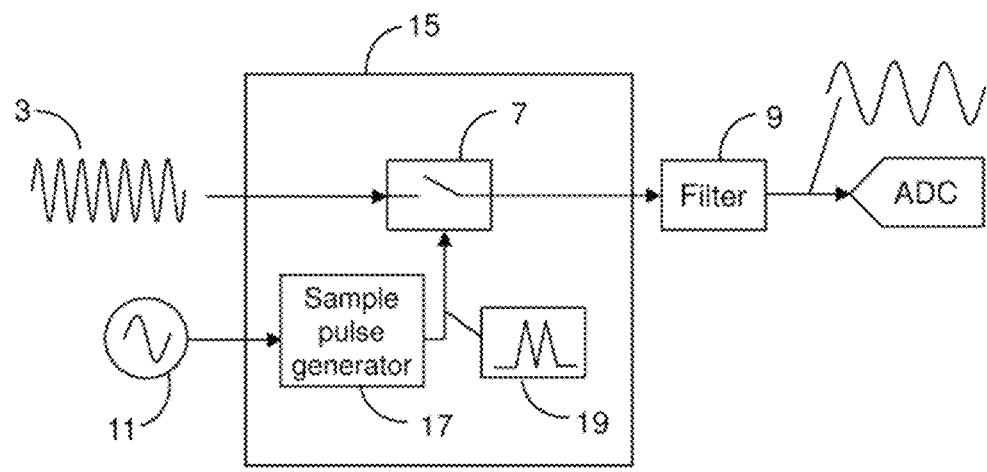
FIG. 3 shows a schematic of a sampling device according to a described embodiment.

In some embodiments, the sampling device of FIG. 2 may include an analogue to digital converter (ADC), for converting the sampled signal from an analogue signal to a digital signal. An example of such a sampling device is shown in FIG. 3. Similarly, the sampling device of FIG. 2 may include a digital to analogue converter (DAC), for converting the input signal from a digital signal to an analogue signal prior to its being sampled. An example of such a sampling device is shown in FIG. 4.

Figure 4:
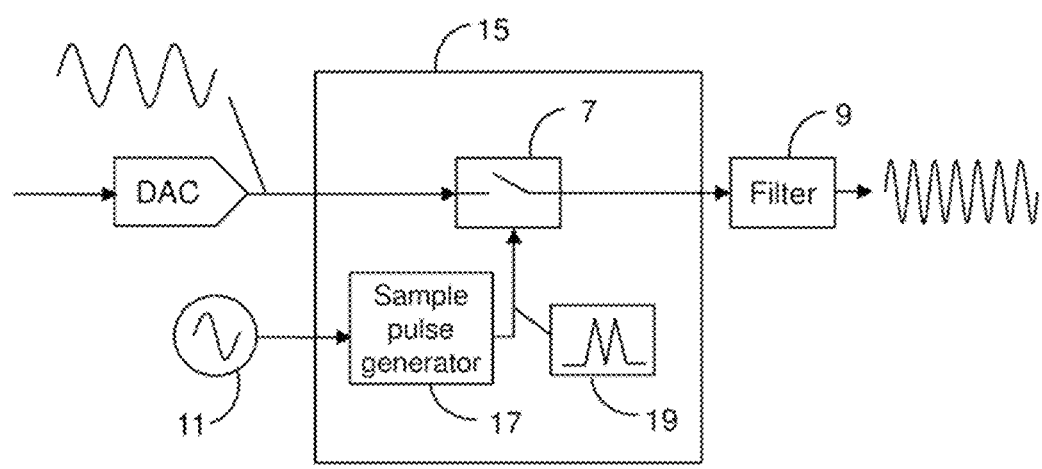
FIG. 4 shows a schematic of a sampling device according to a described embodiment.

In each one of FIGS. 2 to 4, the sample pulse generator 17 is configured to generate a sequence of pulses upon receipt of a signal from the clock signal generator 11. The pulses in the sequence are each used to activate the switch 7. The switch remains closed for the duration of each pulse, and stays opens in the interval between pulses. In this way, the input signal is sampled for the duration of each pulse and is not sampled during the intervals between pulses.

The sample pulse generator generates the same sequence of pulses on arrival of the next signal from the clock signal generator. Over time, therefore, the sample pulse generator outputs a stream of pulses that is made up of the same continually repeating sequence of pulses, each repetition of the sequence being triggered by the arrival of a new clock signal.

Figure 5:
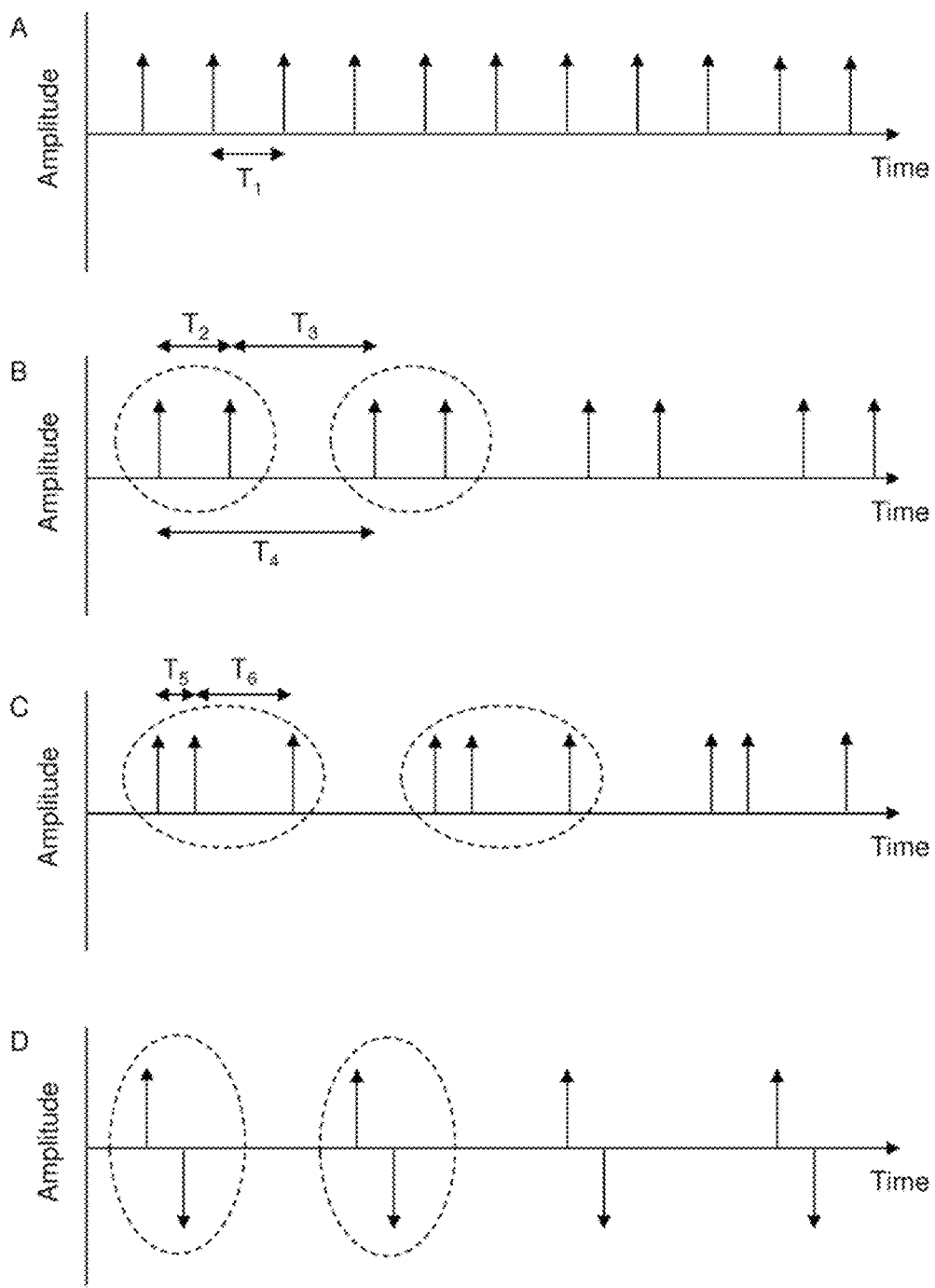
FIG. 5 shows a comparison between a pulse stream used to activate a sampler in a conventional sampling device and pulse streams used in the described embodiments.

The difference between the stream of sampling pulses that is sent to the switch in the conventional device of FIG. 1, and the stream of sampling pulses that is sent to the switch of the device shown in the embodiments of FIGS. 2 to 4 can be explained with reference to FIG. 5.

FIG. 5A shows an example of a pulse stream used to activate the switch in a conventional sampling device as shown in FIG. 1. In this case, each pulse in the stream is separated by the same time interval $T_1$, where $T_1$ denotes the clock period.

FIGS. 5B, 5C and 5D show examples of pulse streams output by the sample pulse generator of FIG. 2. In each case, the stream comprises a repeating sequence of pulses, where the repeated sequence is indicated by the dotted lines. For example, referring to FIG. 5B, the repeated sequence comprises a pair of pulses separated by an interval $T_2$. In each case, the start of a repetition marks the arrival of a new clock signal at the sample pulse generator. Thus, the interval $T_4$ between the first pulse in the sequence, and the first pulse in the next repetition of the sequence is equal to the clock period.

Importantly, unlike the pulse stream shown in FIG. 5A, the intervals between successive pulses in FIGS. 5B, 5C and 5D vary throughout the stream. For example, referring to FIG. 5B, the interval $T_2$ between the pulses in each repetition of the sequence is shorter than the interval $T_3$ between the last pulse in the sequence and the first pulse in the next repetition of the sequence. The variation in intervals may also occur within the actual sequence of pulses that is repeated; as shown in FIG. 5C, the repeated sequence comprises 3 pulses, in which the first and second pulses are separated by a first interval $T_5$ that is shorter than the interval $T_6$ between the second and third pulses.

Each pulse in the stream corresponds to a point in time at which the input signal will be sampled. By sampling the incoming signal at these different intervals, it is possible to vary the frequency spectrum of the output signal. More specifically, by varying the number of sampling pulses in each clock period, and the intervals between them, it is possible to amplify various frequency components in the output signal, whilst reducing others. In effect, the sampling device functions to filter particular frequency components of the input signal, whilst preserving others.

In some embodiments, the stream of pulses may include both positive and negative pulses. FIG. 5D shows an example of a pulse stream with both positive and negative pulses.

The principle underlying the operation of the described embodiments can be explained by reference to FIGS. 6 and 7, which show examples of sampling being carried out using a conventional sampling device, and a sampling device according to an embodiment, respectively.

Figure 6:
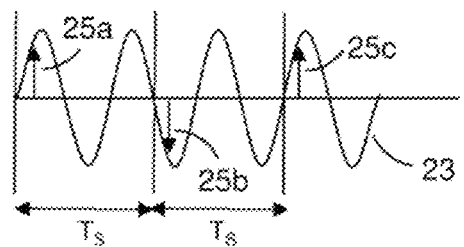
FIG. 6 shows an example of a pulse train used to activate a sampler in a conventional sampling device.
Figure 6:
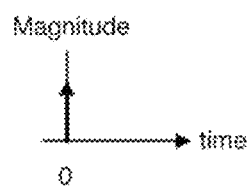
Figure 6:
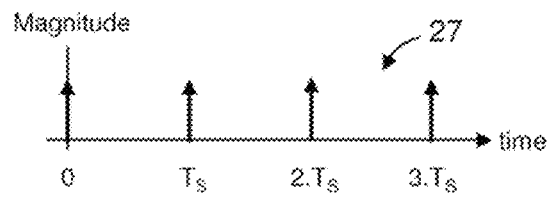
Figure 6:
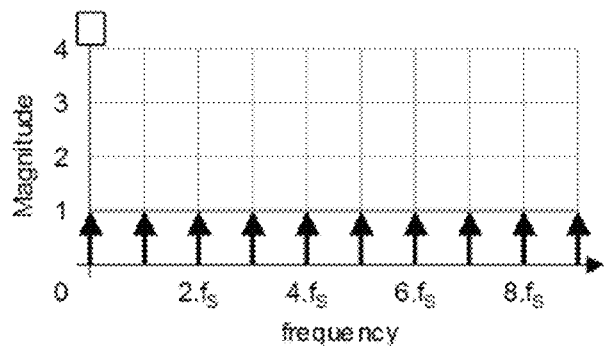
Figure 6:
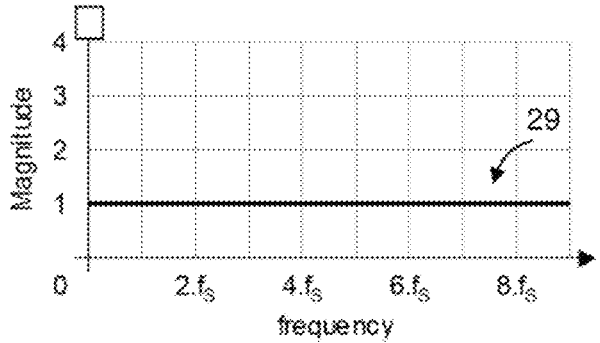

FIG. 6 shows an example of a conventional sampling method. Referring to FIG. 6A, an input signal illustrated as a sinusoidally oscillating wave 23 is sampled once during a succession of sampling windows, each window having a duration $T_S$, where $T_s$ defines the interval between successive clock pulses. In order to achieve this, a series of pulses 25a, 25b, 25c comprising a Dirac pulse train 27 similar to that shown in FIG. 5A, is used to activate the sampler (FIG. 6C). The resultant output signal will be given by the product of the input signal with the Dirac pulse train 27; in the frequency domain, the output will be the convolution of the signal with a Dirac comb.

FIG. 6D shows the relative amplitude of the frequency components $f_S, 2f_S, 3f_S \ldots, 8f_S$ etc. in the pulse stream, where $f_S = 1/T_S$. FIG. 6E shows the envelop 29 of the pulse train in the frequency domain. Since each frequency component has the same relative amplitude, the envelope 29 in FIG. 6E is a flat line. As a result, there is no difference in the extent to which different frequency components of the input signal are amplified/attenuated.

Figure 7:
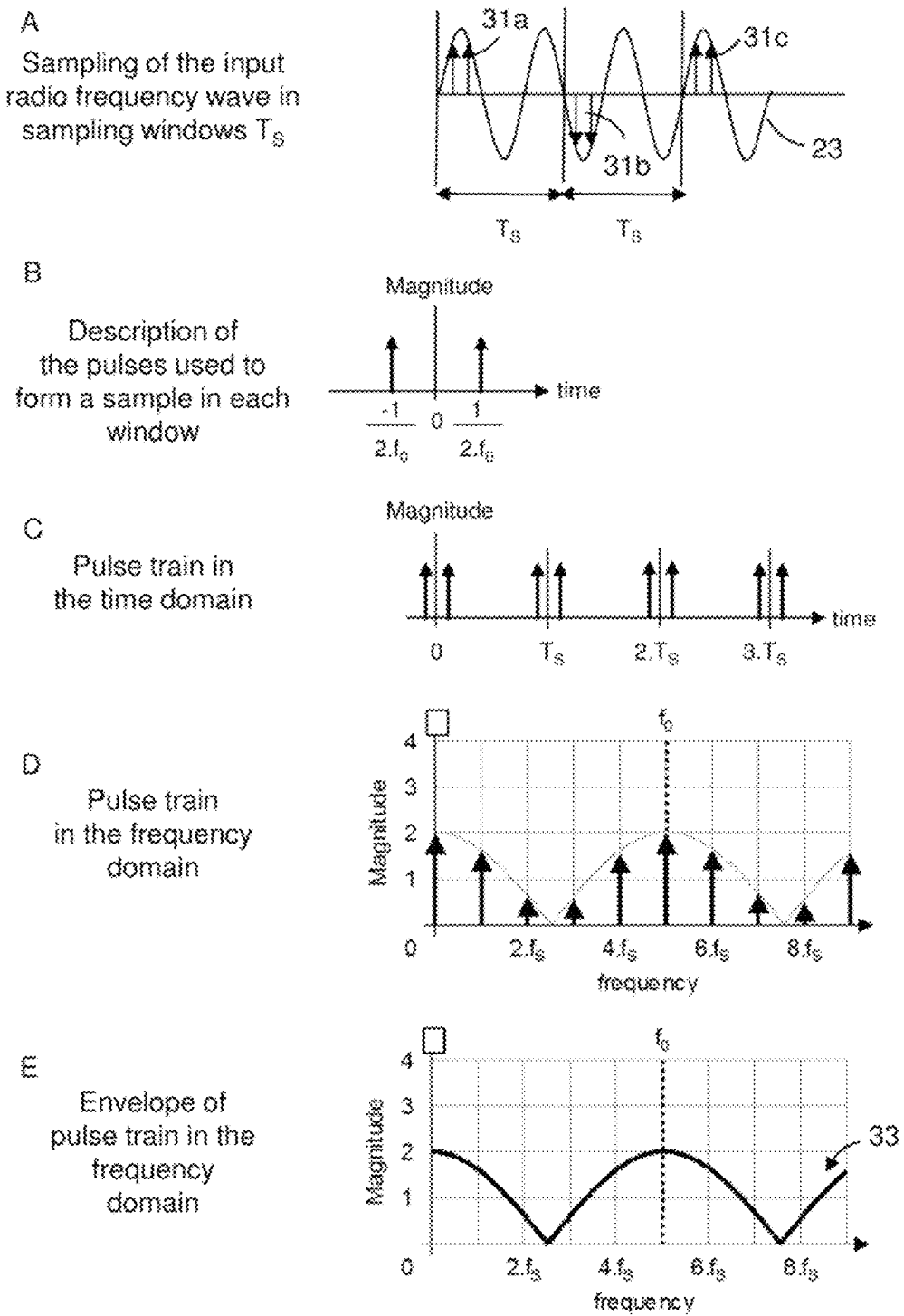
FIG. 7 shows an example of a pulse train used to activate a sampler in a sampling device according to a described embodiment.

FIG. 7 shows an example embodiment, in which the sampling signal comprises a stream of pulses similar to that shown in FIG. 5B. Here, the input signal 23 is sampled twice during each sampling window (a pair of pulses 31a, 31b, 31c is sent to the switch during each dock period $T_s$).

When compared alongside FIG. 6, the arrangement shown in FIG. 7 can be viewed as having a second pulse train alongside the original pulse train. The pulses in the second pulse train are again separated from one another by an interval $T_s$, and are offset from those of the first pulse train by an interval $t_O$, where $t_O = f_O^{-1}$ (in the example shown in FIG. 7, $t_O = 0.2T_s$). In the frequency domain, the presence of the second pulse train creates interference, acting as amplitude modulation of the Dirac comb. In particular, the phase relation between the pulses creates constructive and destructive interferences, as shown by the shape of the envelope in FIG. 7E. The result is that some frequencies of the input signal will be amplified and some frequencies will be attenuated.

The frequencies at which constructive and destructive interference occurs can be controlled by varying the delay (and hence the relative phase) between the two pulse trains. In this way, the sampling device can function as a filter, whose parameters are controlled by varying the delay between the signals used to activate the switch.

The sampled signal will present the usual characteristics of any sampled signal most notably a Nyquist band of half the sampling frequency and the same aliased frequency.

Figure 8:
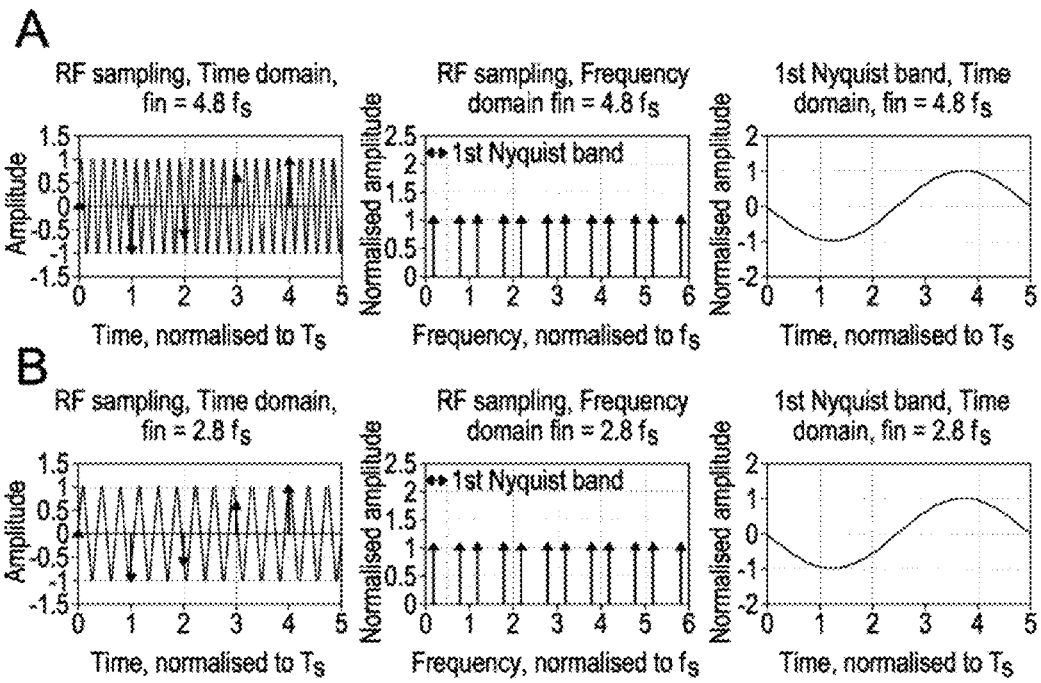
FIG. 8 shows an example of a pulse train used to activate a sampler in a conventional sampling device.
Figure 9:
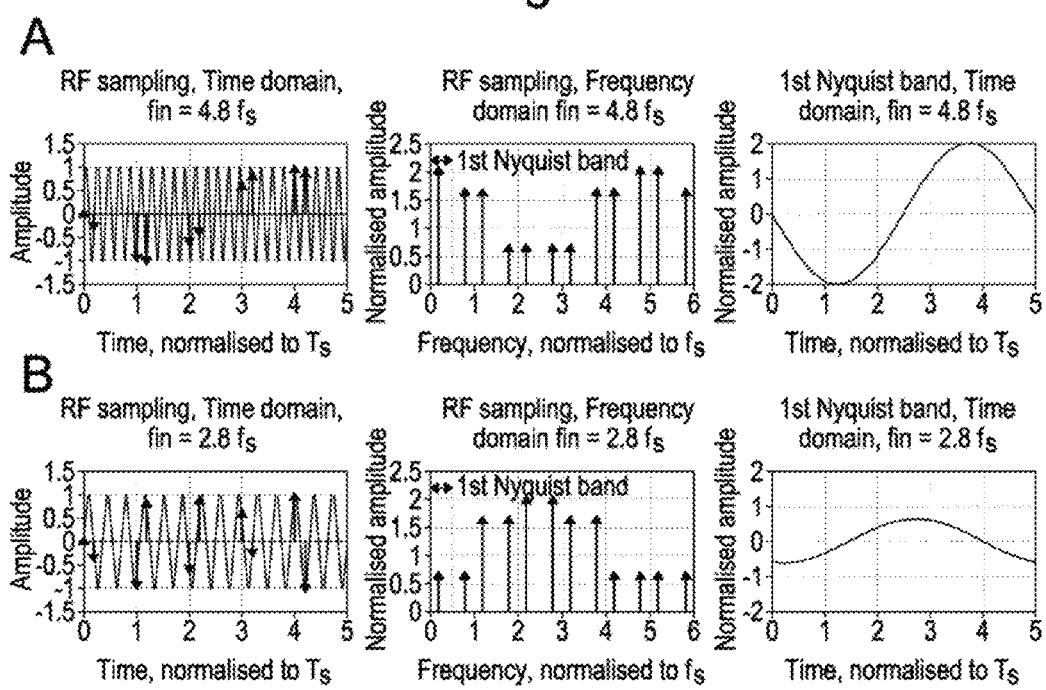
FIG. 9 shows an example of a pulse train used to activate a sampler in a sampling device according to a described embodiment.
Figure 10:
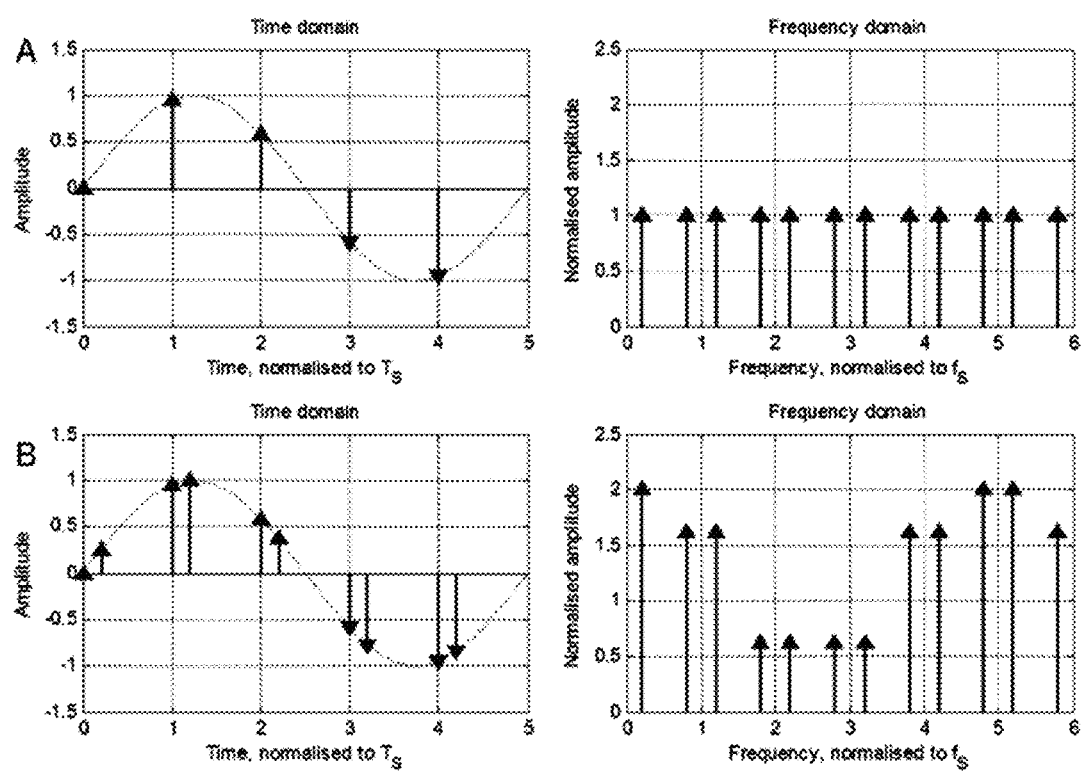
FIG. 10 shows a comparison between a pulse train used to activate a sampler in a conventional sampling device and a pulse train used to activate a sampler in a sampling device according to a described embodiment.

FIGS. 8, 9 and 10 show further examples of how embodiments described herein can help to amplify and attenuate different frequency components of an input signal.

FIG. 8 shows an example of a conventional sampling method suitable for down-conversion of an input frequency from radio-frequency to intermediate frequency. FIG. 8A shows the case where the input signal has a frequency of 4.8 $f_S$, where $f_S$ is the clock frequency and $f_S = 1/T_S$. In FIG. 8B, the input signal has a frequency equal to 2.8 $f_S$. In both cases, the input signal is sampled at intervals of $T_s$ as shown by the arrows. The graphs in the second column of FIG. 8 show the frequency spectrum of each input signal after being sampled. The third column shows the output signal when a low pass filter is used to filter the first Nyquist band. In both cases, the frequency components of the sampled signal are identical; the output from the filter is therefore the same.

FIGS. 9A and 9B show examples of a sampling scheme according to an embodiment, in which the repeating sequence of sampling pulses comprises a pair of pulses. In both cases, the sequence is repeated at a frequency that is equal to the clock frequency $f_S$. The interval between the two sample pulses in the repeating sequence is one fifth of the clock period. Thus, $f_O = 5 f_S$ where $f_O$ is the frequency of pulses in the repeating sequence, and $f_S$ is the frequency of the clock signal. In FIG. 9A, the input signal comprises a sin wave with a frequency of 4.8 $f_S$. In FIG. 9B, the input signal is a sin wave having a frequency of 2.8 $f_S$.

As shown in the middle column of FIG. 9, by using the modified stream of sampling pulses to activate the sampler, certain frequency components of the input signal are amplified, whilst others are attenuated. In FIG. 9A, the frequency component in the first Nyquist band is doubled compared to the conventional sampling shown in FIG. 8; referring to the third column of FIG. 9A, when a low pass filter is used to filter the first Nyquist band, the same signal is obtained as that shown in FIG. 8A, but the signal magnitude is doubled. In contrast, in FIG. 9B, the frequency component in the first Nyquist band is halved compared to that shown in FIG. 8B.

FIG. 10A shows a conventional sampling method used for up-conversion of e.g. an intermediate frequency signal to a radio frequency signal. FIG. 10B shows an example in which up-conversion is performed using a sampling device according to an embodiment described herein. As in FIG. 9B, the sampling scheme used in FIG. 10B is 2 positive pulses in each clock period, with the frequency of the pulses $f_0$ in each pair being equal to $5.f_S$.

In the conventional sampling method shown in FIG. 10, the sampling device generates many images of the input signal, on both sides of the multiples of the sampling frequency. All images have the same amplitude (assuming Dirac pulses). In FIG. 10B, images are generated at the same frequencies as FIG. 10A, but their amplitude is not constant. For example, at a frequency of $5.f_S$, the amplitude is doubled compared to that shown in FIG. 10A. The amplified frequency components can be recovered through use of a suitable filter, for example.

Figure 11:
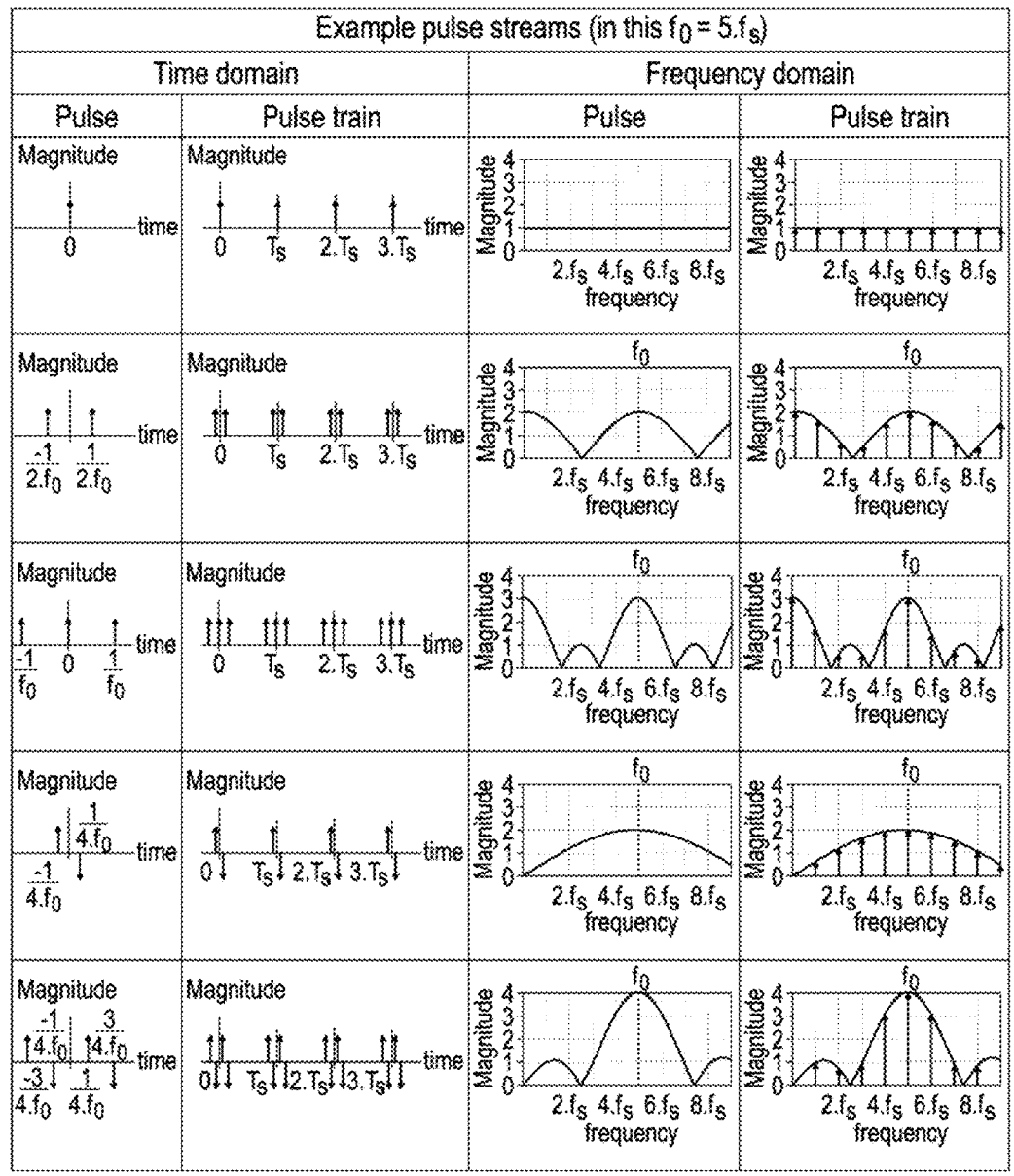
FIG. 11 shows further examples of pulse trains used for activating a sampler in a sampling device according to a described embodiment.

The principle described above for two positive pulses can also be used with other sampling signals. FIG. 11 shows different examples of pulse trains assuming ideal Dirac pulses. In some embodiments, the polarity of the sampling pulses may vary throughout the course of each repeated sequence. Signals whose polarity is changed in this way can be considered as "negative" signals or pulses, as opposed to positive signals. Examples of this are shown in last two rows of the table of FIG. 11. In such cases, the amplitude of the input signal at the point of sampling is made negative before being output from the system. As shown in the bottom two rows of the table of FIG. 11, the use of both positive and negative pulses can provide a strong attenuation of the very low frequencies, and also allows wider signal bandwidths.

In practice, Dirac pulses are not feasible, and the ideal Dirac pulses of FIGS. 6 and 7 will be replaced by short pulses having a finite width that defines the period of time for which the switch is in its closed configuration. The duration of the pulse must be reasonably short in comparison to the clock period. If this is not the case, averaging effects will lead to significant losses. Conversely, reducing the duration of the pulses will increase losses as a smaller fraction of the input signal will be transmitted through the sampling device.

Figure 12:
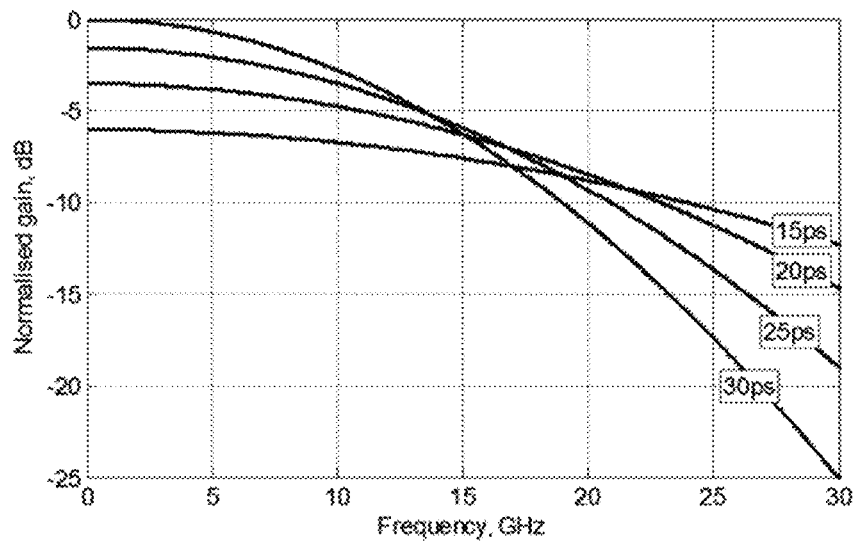
FIG. 12 shows how the gain profile of different frequency components in the input signal varies depending on the width of pulses used to activate the sampler.

The optimum duration for each sampling pulse will depend on the pulse shape and on the signal frequency. FIG. 12 shows examples of normalised attenuation with a Gaussian pulse of different widths (attenuation has been normalised because it depends on the sampling frequency). At 20 GHz, a 20 ps pulse width gives the highest power (note, for the Gaussian pulses described herein, the term "pulse width" is intended to refer to the full width at half maximum). Generation and propagation of such short pulses require very high speed components with at least 50 GHz bandwidth (10 ps rise and fall time). Therefore these systems have two main limitations in reaching high frequencies, namely, huge losses and the requirement that the clock bandwidth is between 2 and 2.5 times the maximum frequency of the input signal.

Figure 13:
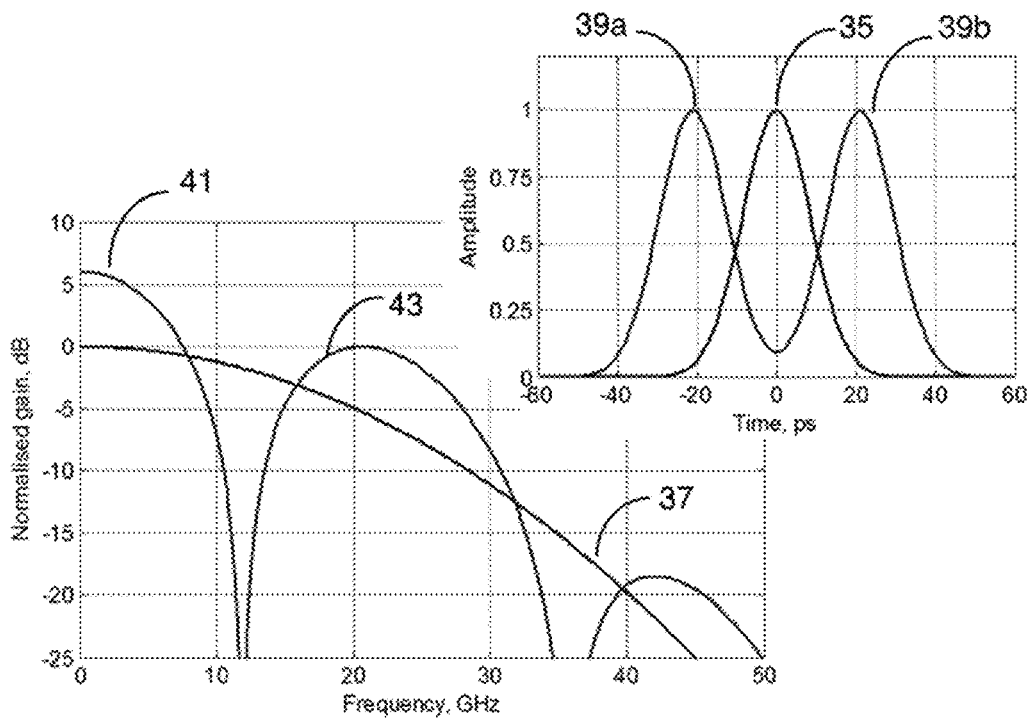
FIG. 13 shows how the gain profile of the different frequency components of the input signal varies when using a conventional sampling device and when using a sampling device according to a described embodiment.
Figure 14:
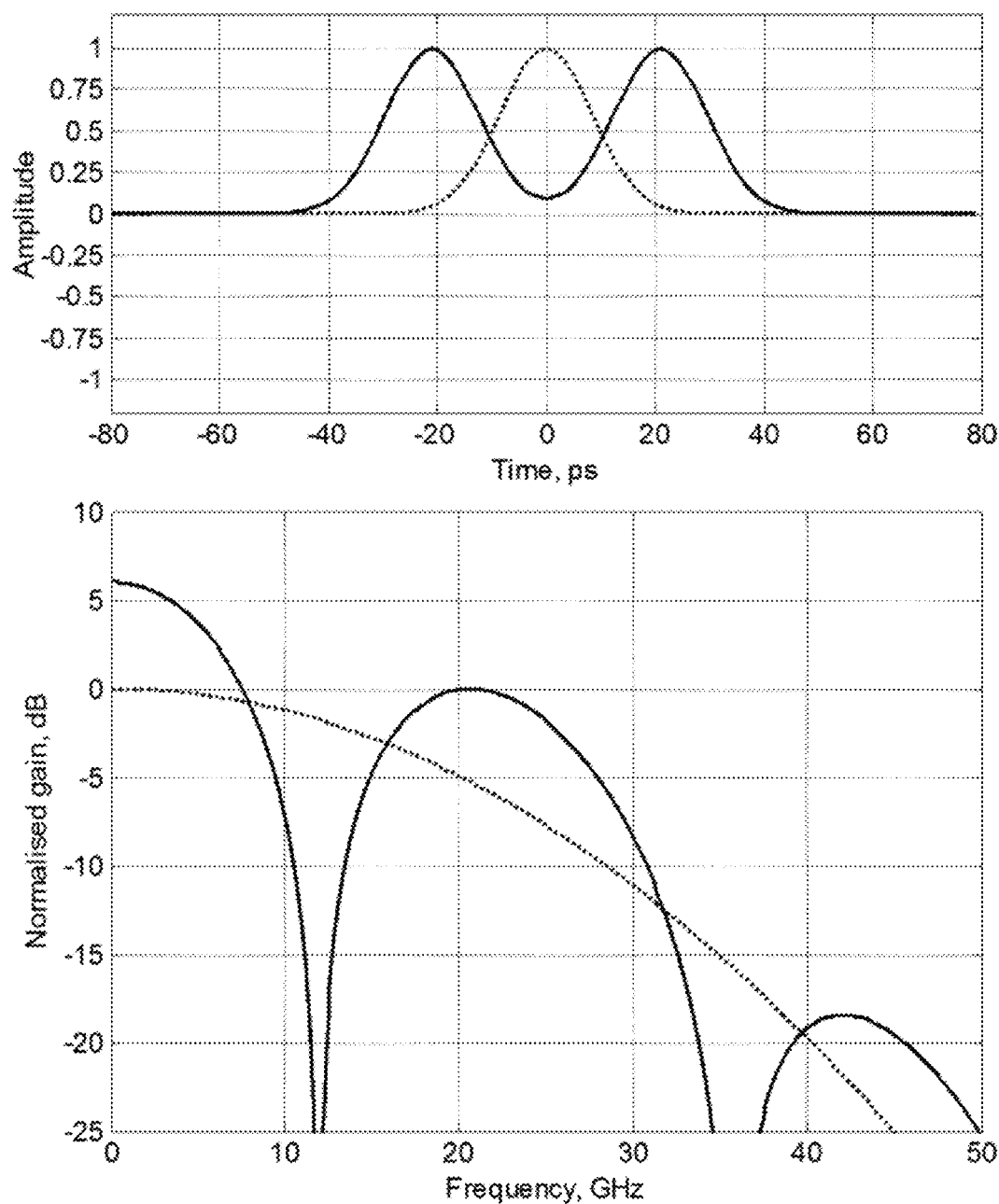
FIG. 14 shows how the gain profile of the different frequency components of the input signal varies when using a conventional sampling device and when using a sampling device according to a described embodiment.
Figure 15:
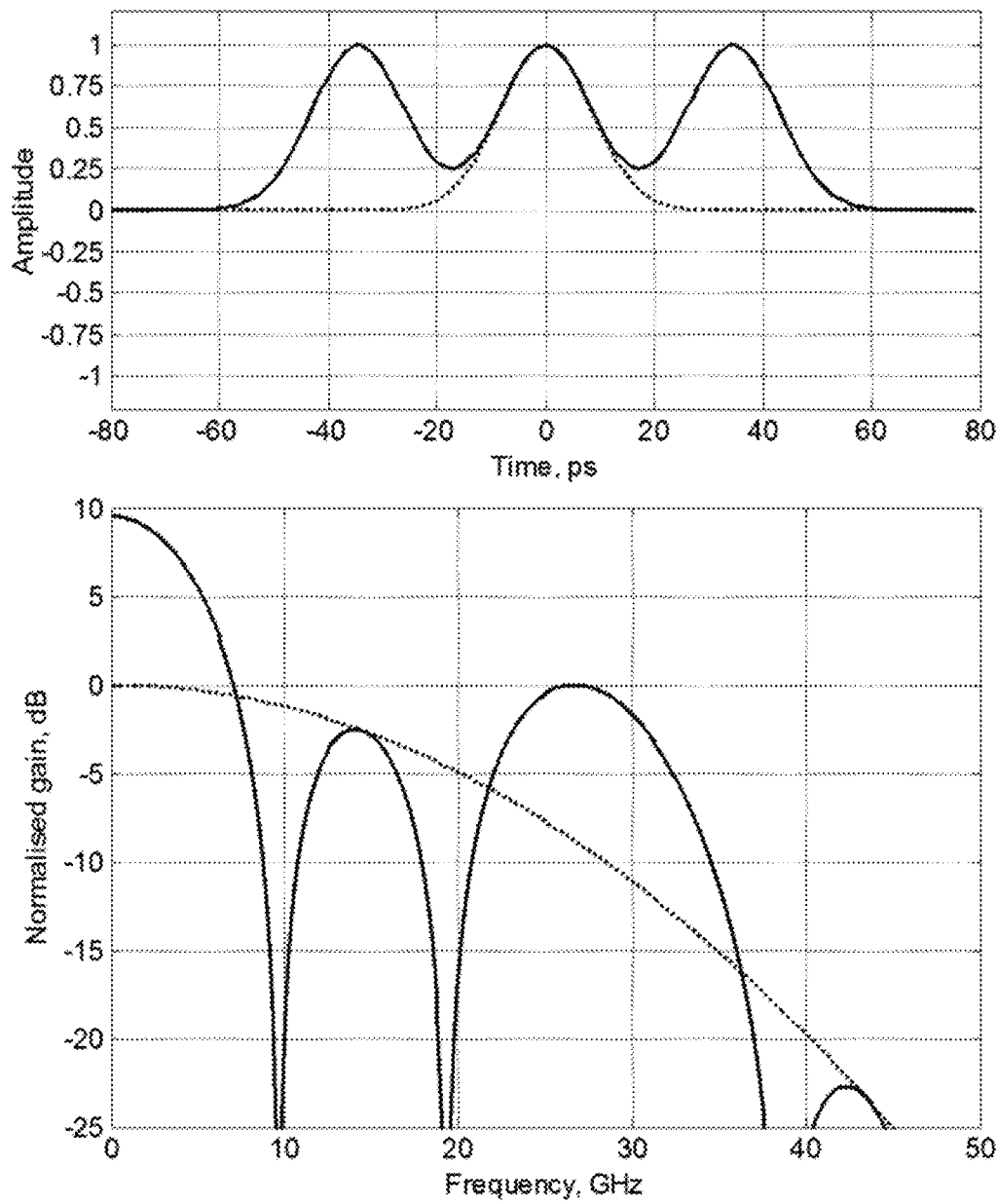
FIG. 15 shows how the gain profile of the different frequency components of the input signal varies when using a conventional sampling device and when using a sampling device according to a described embodiment.
Figure 16:
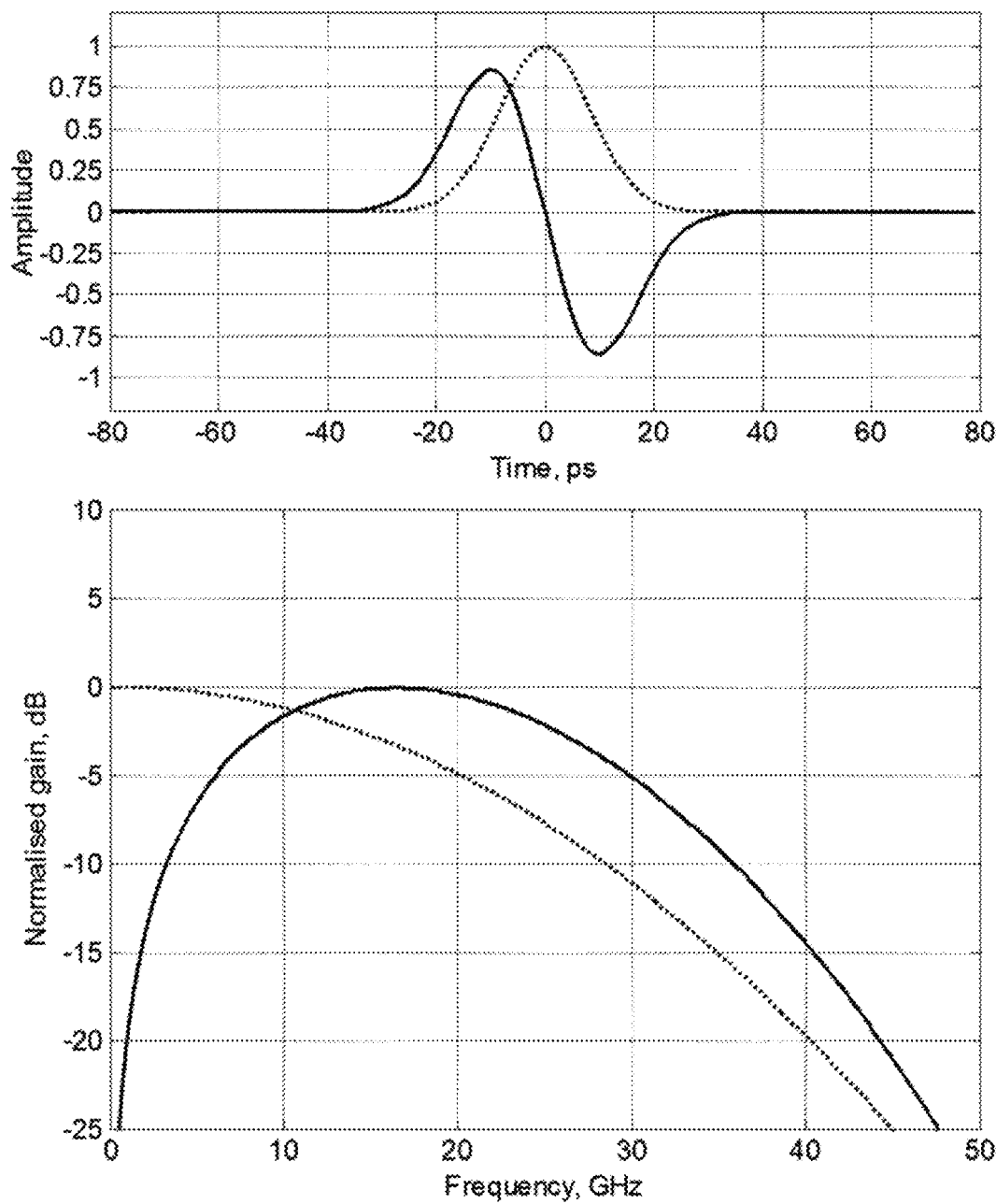
FIG. 16 shows how the gain profile of the different frequency components of the input signal varies when using a conventional sampling device and when using a sampling device according to a described embodiment.
Figure 17:
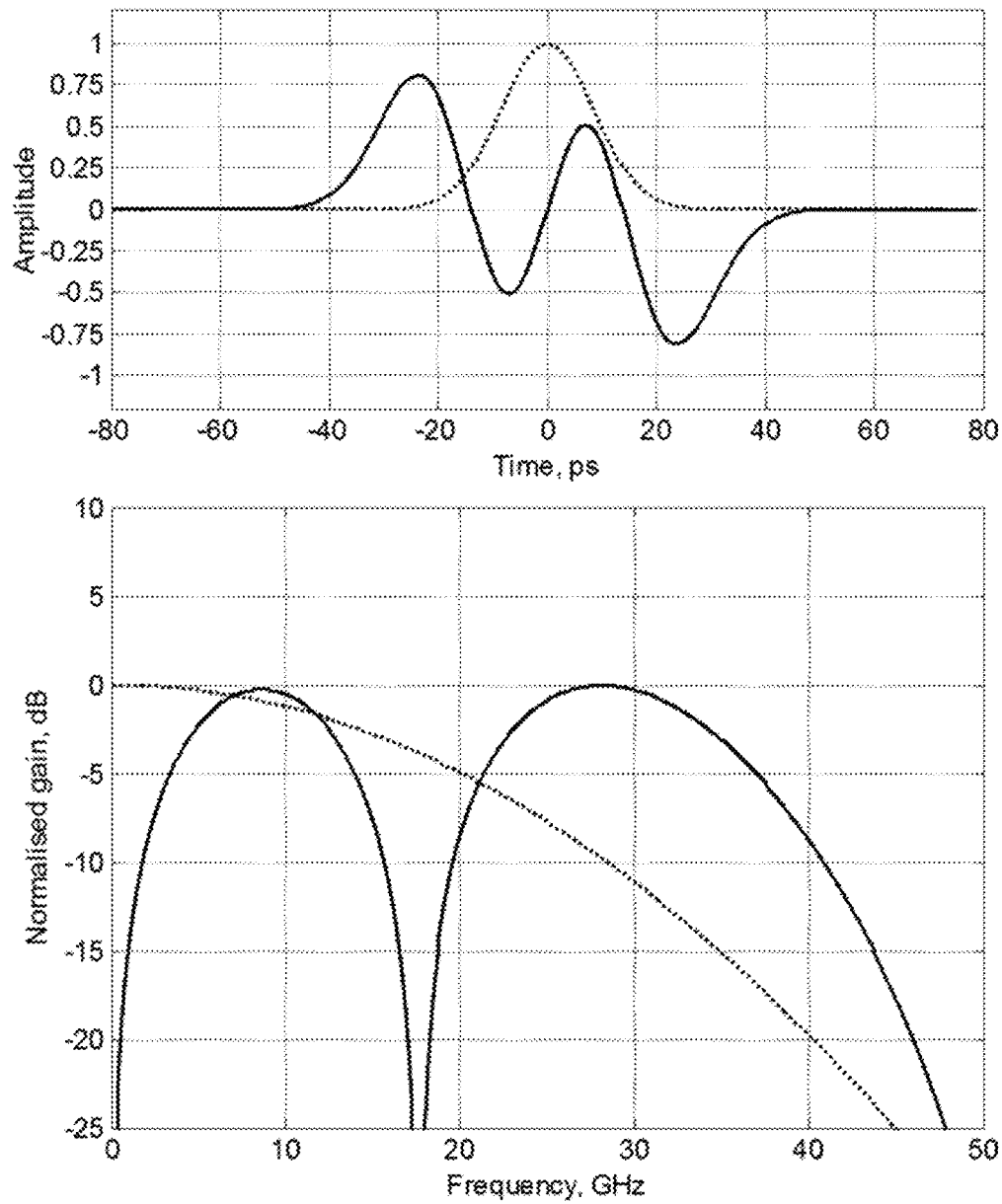
FIG. 17 shows how the gain profile of the different frequency components of the input signal varies when using a conventional sampling device and when using a sampling device according to a described embodiment.

FIG. 13 shows how different frequency components of the input signal are amplified to different extents when using a conventional sampling method and when using a sampling method according to an embodiment described herein. The inset part of FIG. 13 shows an example a sequence of pulses output by the sample pulse generator during a single clock period. The main part of FIG. 13 shows how the gain profile for different frequency components of the input signal.

In the conventional method, the input signal is sampled once during each clock period. Referring to the inset, the sampling signal comprises a single Gaussian shaped pulse 35, which in this example is 20 ps in duration. The main part of FIG. 13 shows the gain profile for the different frequency components of the input signal, i.e. it shows the extent to which the different frequency components of the input signal are amplified. In the conventional method, the gain profile defines a smooth curve 37, which has its maximum at lower frequencies, with the amount of gain decreasing continuously as the frequency rises.

In contrast, in the sampling method used in embodiments described herein, the pulse sequence output by the sample pulse generator comprises a pair of Gaussian shaped pulses 39a, 39b. In this example, the two pulses each have a width of 20 ps with the peak to peak time between the two pulses being arbitrarily chosen to be 42 ps (note that, since the pulse width is the same as in the conventional method, the bandwidth requirement for the sampling pulses is unchanged).

Unlike in the conventional method, the graph of gain versus frequency comprises a series of bands. In particular, the graph exhibits two bands 41, 43 with less than 5 dB attenuation, from DC to 9.5 GHz, and from 15 to 28 GHz. Although the first of these two frequency bands is of low interest (the conventional sampling method maintains a signal with less than 5 dB up to 20 GHz), the second frequency band shows a huge improvement over the conventional sampling: the highest frequency that can be reached with less than 5 dB attenuation is extended from 20 to 28 GHz. Thus, by activating the switch using a stream of pulses according to embodiments described herein, it is possible to increase the relative amplitude of the higher frequency components in the output signal compared to using the conventional method.

FIGS. 14 to 17 show how the gain profile varies when using different sequences of pulses to activate the sampling switch. In each Figure, the upper part of the Figure shows the form of the sampling pulses in the time domain, whilst the bottom part of the Figure shows the gain profile for the different frequency components. In each case, the result of using a conventional sampling method is shown for comparison in dotted lines.

Sampling the input signal multiple times within each clock period provides an overall increase in the power of the sampled signal. Embodiments described herein can therefore provide a boost to the gain and reduce losses associated with conventional pulse-sampling systems. These losses are currently one of the main limitations of sampling systems as they hugely reduce the signal to noise ratio. The sum of the power increase and filtering effect increases the system gain by up to 6 dB for two pulses, 9.5 dB for 3 pulses and 12 dB for 4 pulses. This improvement can be used either to increase the SNR at low frequency or to extend the highest frequency for which the system achieves enough resolution.

Figure 18:
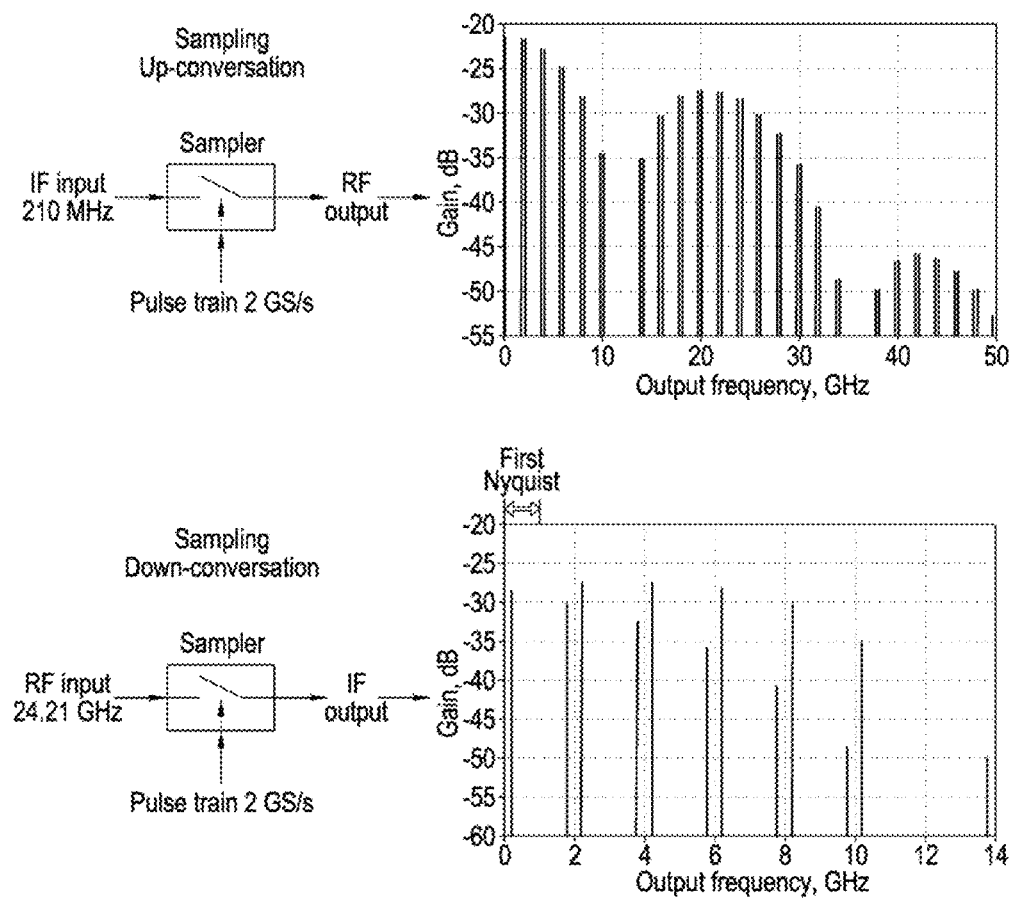
FIG. 18 shows examples of the frequency spectrum of the output signal obtained when using a sampling device according to a described embodiment for up conversion and down-conversion.

As shown previously in FIGS. 9 and 10, a sampling device of embodiments described herein can be used for both up and down conversion. In down-conversion, a high frequency signal received from, e.g. an antenna, is down-converted and digitised. Direct sampling techniques are based on the sampling theory and consist in down-converting a high frequency signal by intentional baseband aliasing. The resulting signal can then be quantized to finish the digitisation process. This avoids the need for conventional analogue frequency conversions using heterodyning, and enables the analysis of very large input bandwidths. The same principle can be used in an emitter for up-conversion: a high frequency signal is directly generated from an intermediate frequency without heterodyne frequency conversion. FIG. 18 shows these two options: either an intermediate frequency signal is sampled for up-conversion or an RF signal is sampled for down-conversion.

Example embodiments of a sampling device will now be described by reference to FIGS. 19 to 23.

Figure 19:
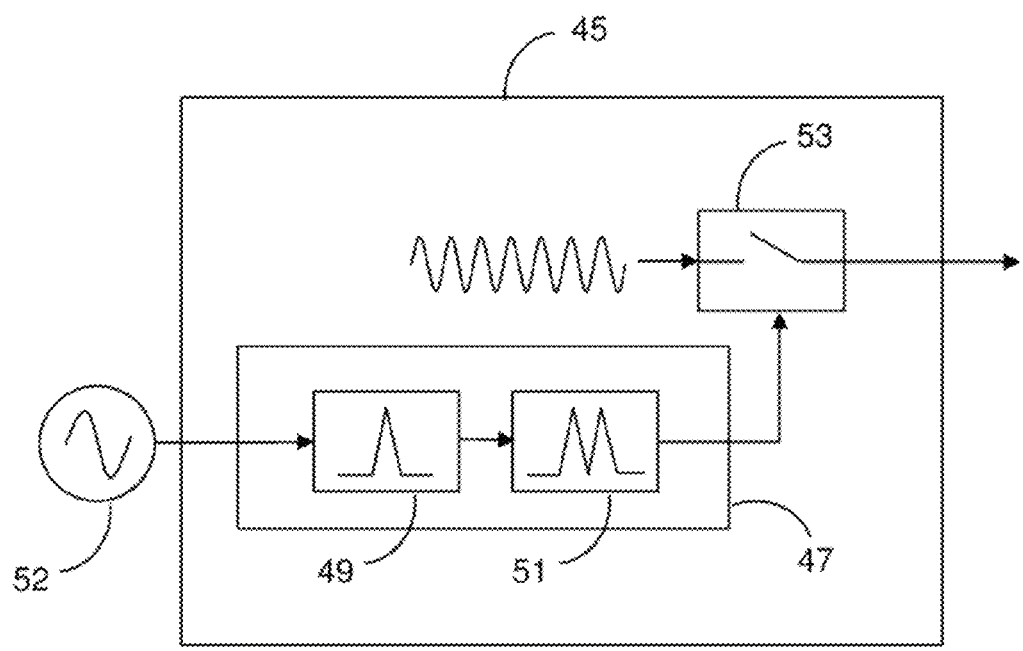
FIG. 19 shows a schematic of a sampling device including a sample pulse generator according to a described embodiment.

FIG. 19 shows an example of a sampling device 45 according to a described embodiment. As in FIG. 2, a sample pulse generator 47 is used to generate a stream of sampling pulses for activating the sampling switch. The sample pulse generator 47 comprises a pulse generator 49 and a pulse repeater 51. The pulse generator itself is activated by a clock signal 52 having a predetermined frequency.

The pulse repeater gene rates an additional pulse or pulses each time it receives a signal from the pulse generator. Thus, for each pulse sent to the sampling device from the clock signal generator, a plurality of pulses is generated for activating the switch 53 used to sample the input signal. The amplitude of the input signal is sampled in the periods during which the switch is closed.

The pulse repeater may function by creating an echo of the initial input pulse with a short delay. By doing so, the pulse repeater produces two pulse trains, each having the same frequency as the clock signal, but slightly delayed in time with respect to one another. The sampling pulses output by the repeater may be in order of 5-20 ps in width at frequencies of 10 s of GHz. Since the sampling pulses are locked on to the clock signal, they can be readily synchronised with other elements of the system which are also controlled by the clock signal.

Figure 20:
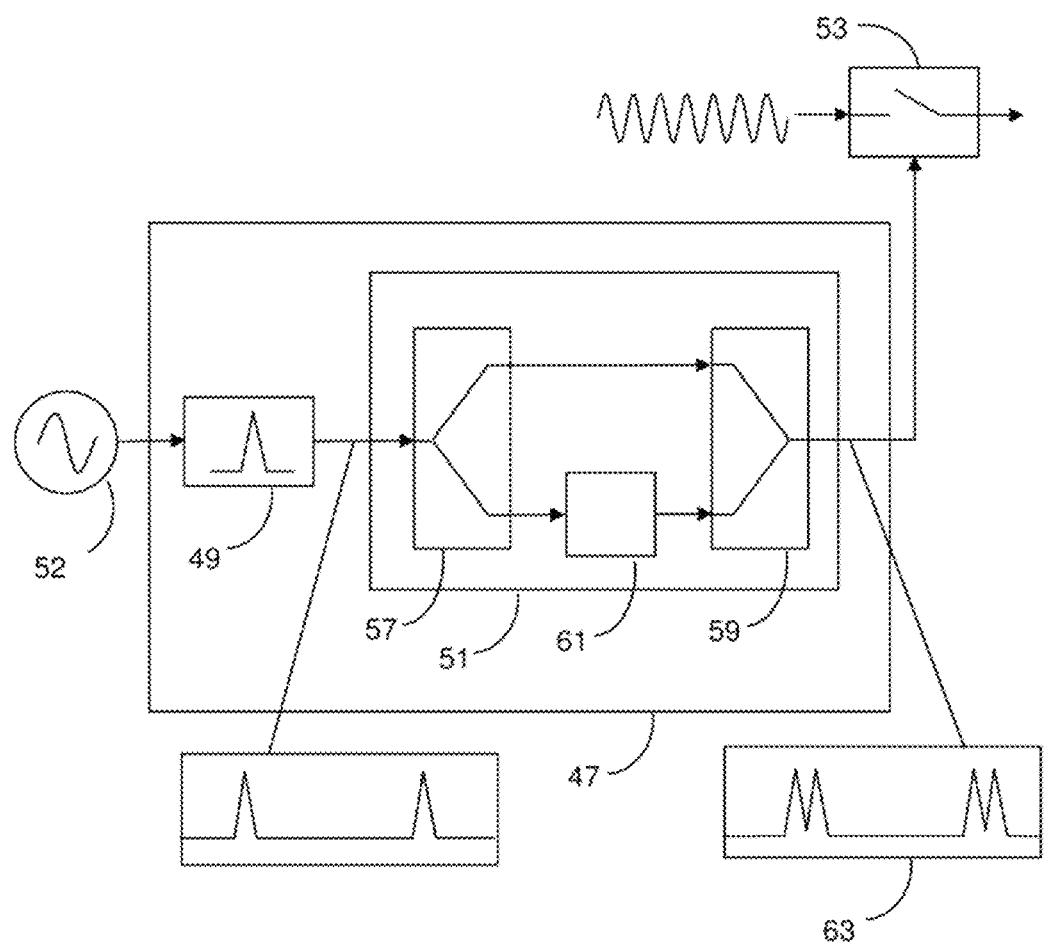
FIG. 20 shows an example configuration for the sample pulse generator of FIG. 19.

FIG. 20 shows an example of how the pulse repeater 51 may be implemented in practice. In this example, the pulse repeater 51 comprises a signal splitter 57 that splits the initial pulse received from the pulse generator 49 into two pulses that travel along different paths. The two paths are then combined into a single path in a signal combiner 59. A variable delay 61 is introduced into one of the paths between the splitter and the combiner, such that a pulse travelling along that path is delayed in reaching the combiner compared to the pulse travelling along the other path. As a result, the signal combiner outputs a pair of pulses that are temporally offset from one another. The process is repeated for each pulse received from the pulse generator, resulting in a pair of pulse trains 63 having the same frequency, but offset in time from one another.

Figure 21:
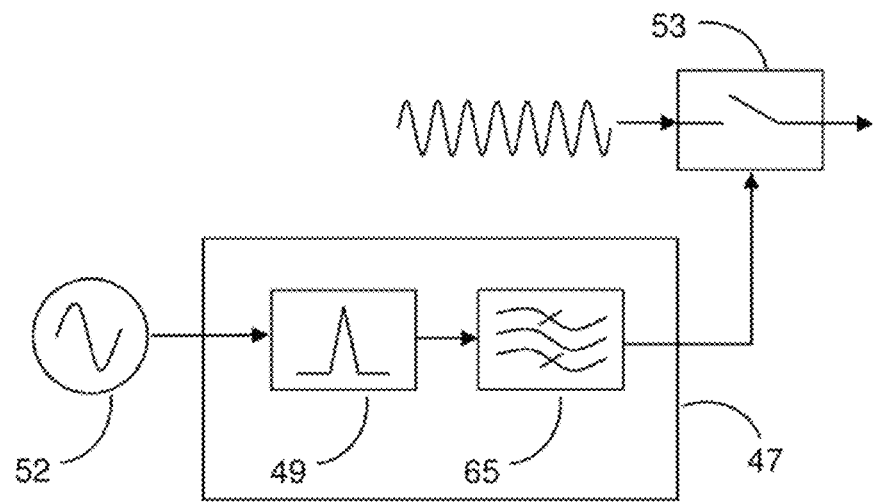
FIG. 21 shows a further example configuration for the sample pulse generator of FIG. 19.

FIG. 21 shows another example of a pulse repeater, using a filter 65. The filter may comprise a component that can be used to generate the derivative of the input signal. With such a circuit it is very easy to generate the sequence of pulses shown in the fourth row of FIG. 11.

Figure 22:
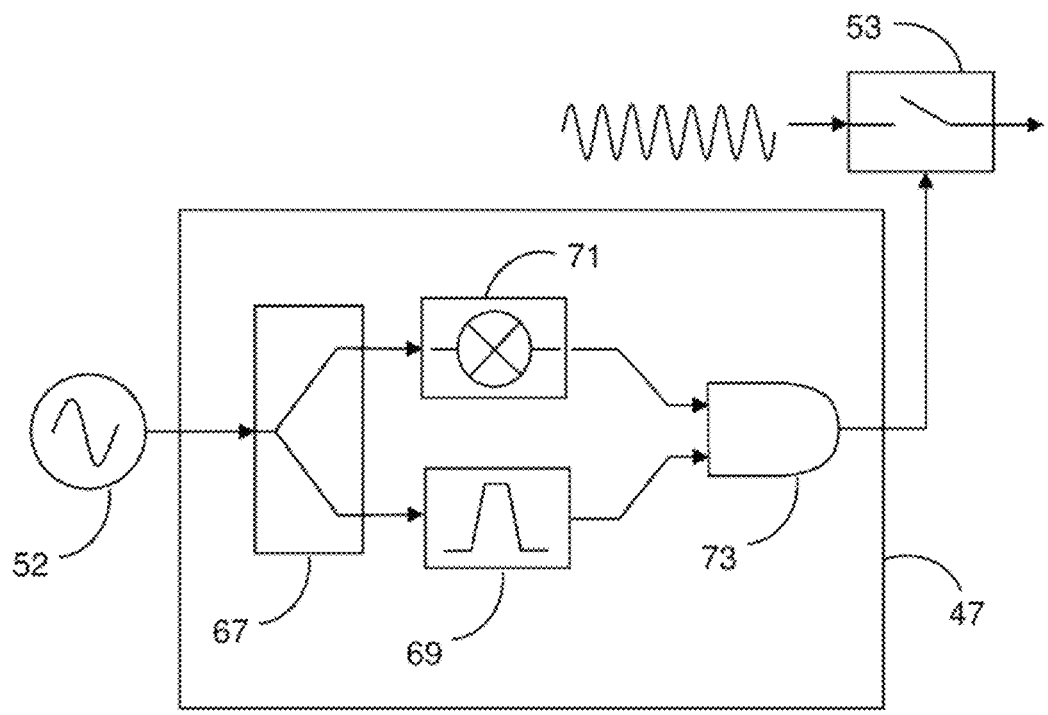
FIG. 22 shows a still further example configuration for the sample pulse generator of FIG. 19.

FIG. 22 shows how an implementation of the sample pulse generator according to another embodiment described herein. In this example, the sample pulse generator 47 includes a splitter 67 that splits a signal from the clock signal generator 52 into two paths leading to a pulse generator 69 and a frequency multiplier 71 respectively. The pulse generator 69 produces a single output pulse, whilst the frequency multiplier 71 produces an oscillating signal, which in effect comprises a series of high frequency pulses. The oscillating signal can therefore provide the sequence of pulses used to activate the sampling switch during each clock period.

The output from the frequency multiplier and the pulse generator are both input into an AND gate 73. The AND gate transmits the series of pulses received from the frequency multiplier for as long as the input from the pulse generator remains above a threshold value. The pulse generator 69 thereby serves to enable and disable the high frequency signal generated by the frequency multiplier 71. Thus, each time a signal is received from the clock signal generator, a predetermined number of sampling pulses are output from the AND gate 73 to the sampling switch.

Although the implementation shown in FIG. 22 uses more active components than other implementations discussed herein, it can be more easily tuned. For example, the frequency of the oscillator, which determines the temporal separation between successive pulses in the repeating sequence of pulses, can easily be tuned externally. Similarly, the pulse generator output, which will determine the actual number of pulses in the sequence (i.e. the number of pulses transmitted to the switch during each sampling window) can also easily be tuned.

Figure 23:
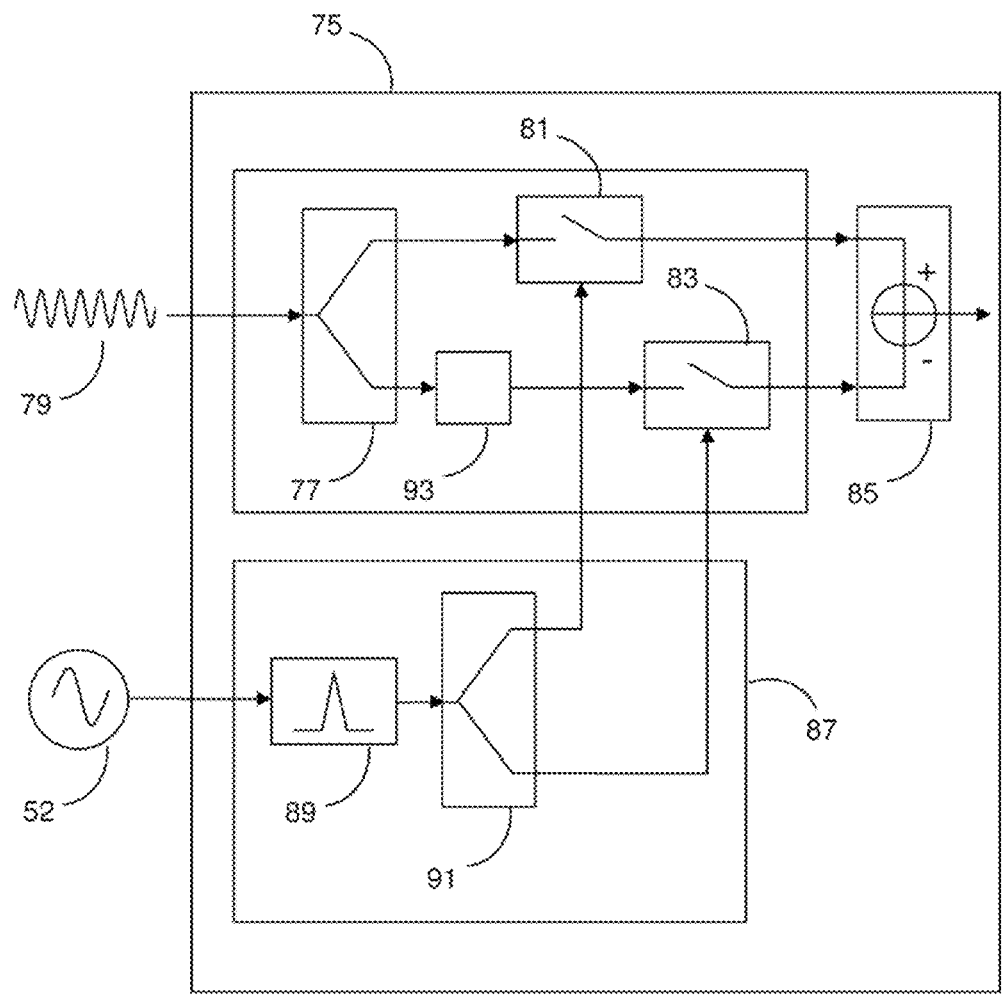
FIG. 23 shows a schematic of a sampling device according to a described embodiment.

In the embodiments described above, the amplification/attenuation of the various frequency components of the input signal is achieved by activating the sampler at different intervals in time. However, it will be appreciated that a similar effect can be achieved by delaying the incoming signal itself, rather than the signals that are used to activate the sampler. FIG. 23 shows an example of how this can be implemented in practice. Here, there is shown a sampling device 75 according to another embodiment described herein. The sampling device comprises a first splitter 77 that is used to split the input signal 79 between two paths, wherein each path has its own respective switch 81, 83 for sampling the received signal. The output from each switch is combined in a signal summing means 85. (In this example, the output from one switch is subtracted from the other, but in alternative embodiments the outputs may be added together).

The sampling device comprises sample pulse generator 87 for activating the two switches. The sample pulse generator 87 includes a pulse generator 89 that is activated by a clock signal received from a clock signal generator 52, and a splitter 91 that is used to split the resultant pulse into two pulses, each pulse being used to activate one of the switches.

A variable delay 93 is provided in one of the two paths of the input signal, before the sampling switch 83. The signal that propagates along the path is, therefore, delayed with respect to the signal propagating along the other path. The result is that, when the two switches 81, 83 are closed simultaneously, they effectively sample the input signal at different points in time.

Figure 24:
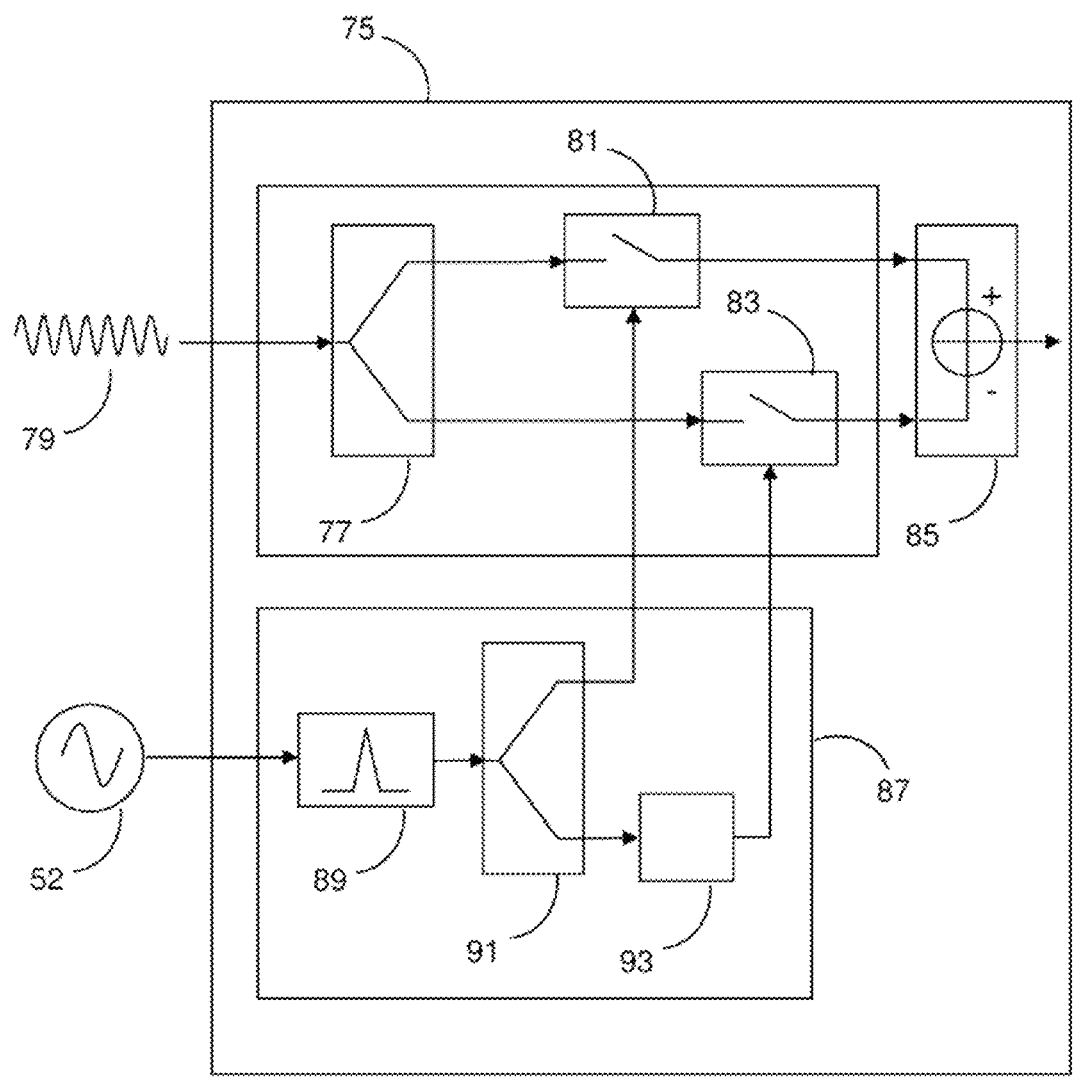
FIG. 24 shows a schematic of a sampling device according to a described embodiment.

An alternative arrangement is shown in FIG. 24, in which the variable delay is provided within the sample pulse generator 87. Here, the delay 93 is used to delay one of the two sampling pulses that are generated by the splitter 91 with respect to the other. As a result, the switches 81, 83 in the respective input paths are activated at different points in time.

Figure 25:
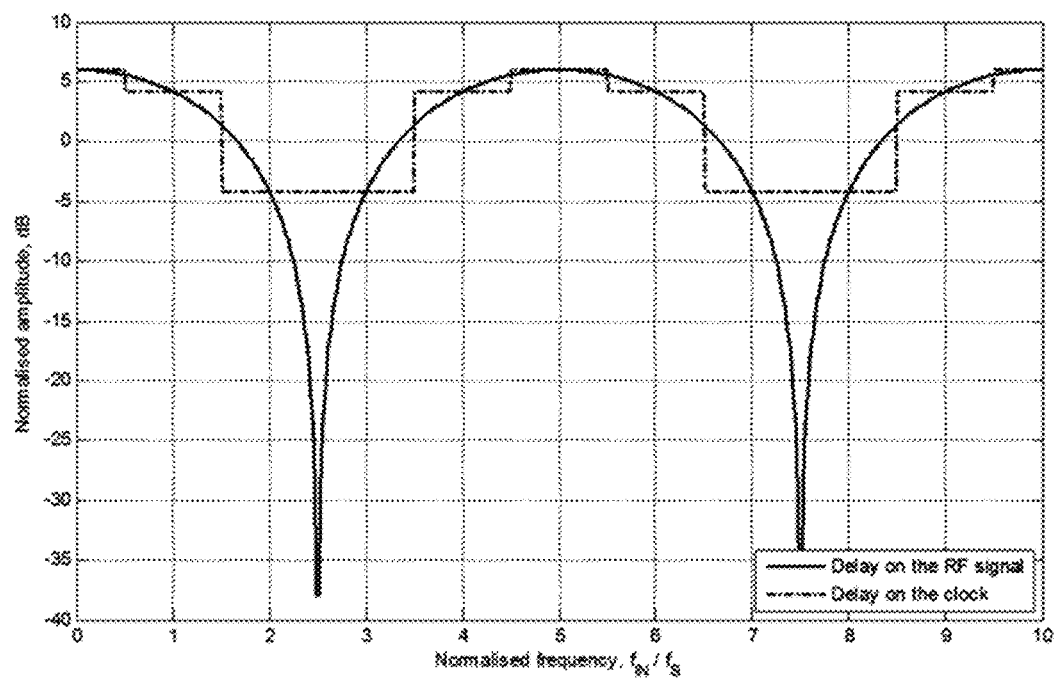
FIG. 25 shows the gain profile for different frequencies, when using the sampling devices shown in FIGS. 23 and 24.

In practice, the arrangements shown in FIGS. 23 and 24 produce different filtering effects. FIG. 25 shows the resultant gain profile of different frequencies when using the arrangements of FIG. 23 (solid line) and FIG. 24 (dashed line). In this example, $f_O$ is taken to be equal to 5 $f_S$, as in FIG. 7.

In the arrangement shown in FIG. 23, the desired interference between the plurality of sampled signals occurs in the RF domain, resulting in the smooth gain profile shown in FIG. 25. In contrast, when using the arrangement shown in FIG. 24, the resulting gain profile for the input signal is stepped, with the amplitude being constant on the two Nyquist bands around each multiple of the clock frequency. The arrangement shown in FIG. 23 is therefore more suitable for down-conversion.

Figure 26:
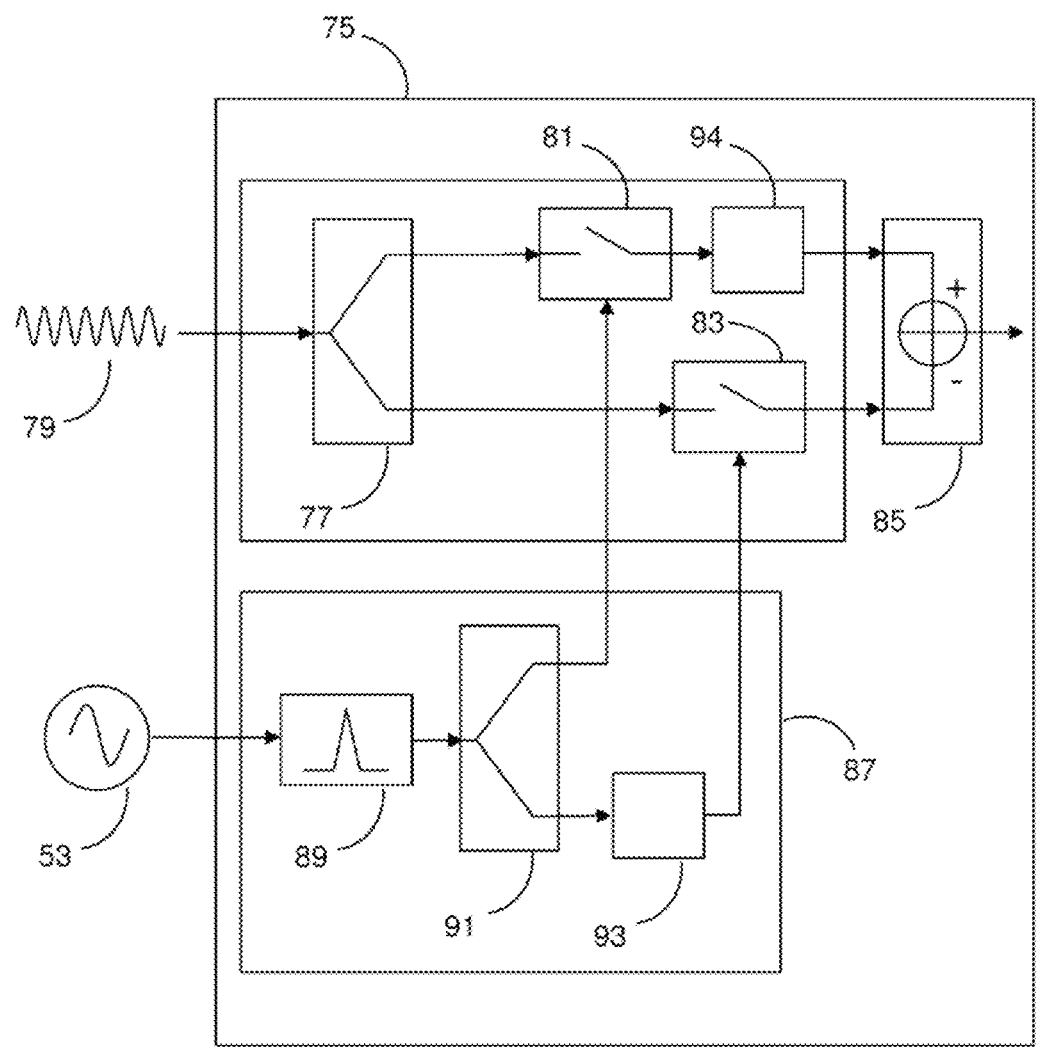
FIG. 26 shows a schematic of a sampling device according to a described embodiment.

FIG. 26 shows another arrangement, which can be used to provide the same filtering effect as the arrangement shown in FIG. 23, and which is also suitable for down conversion. In this instance, as well as providing a delay 93 for activating the switch 83 in one of the input signal paths, an additional delay 94 is provided after the switch 81 in the other input signal path.

Figure 27:
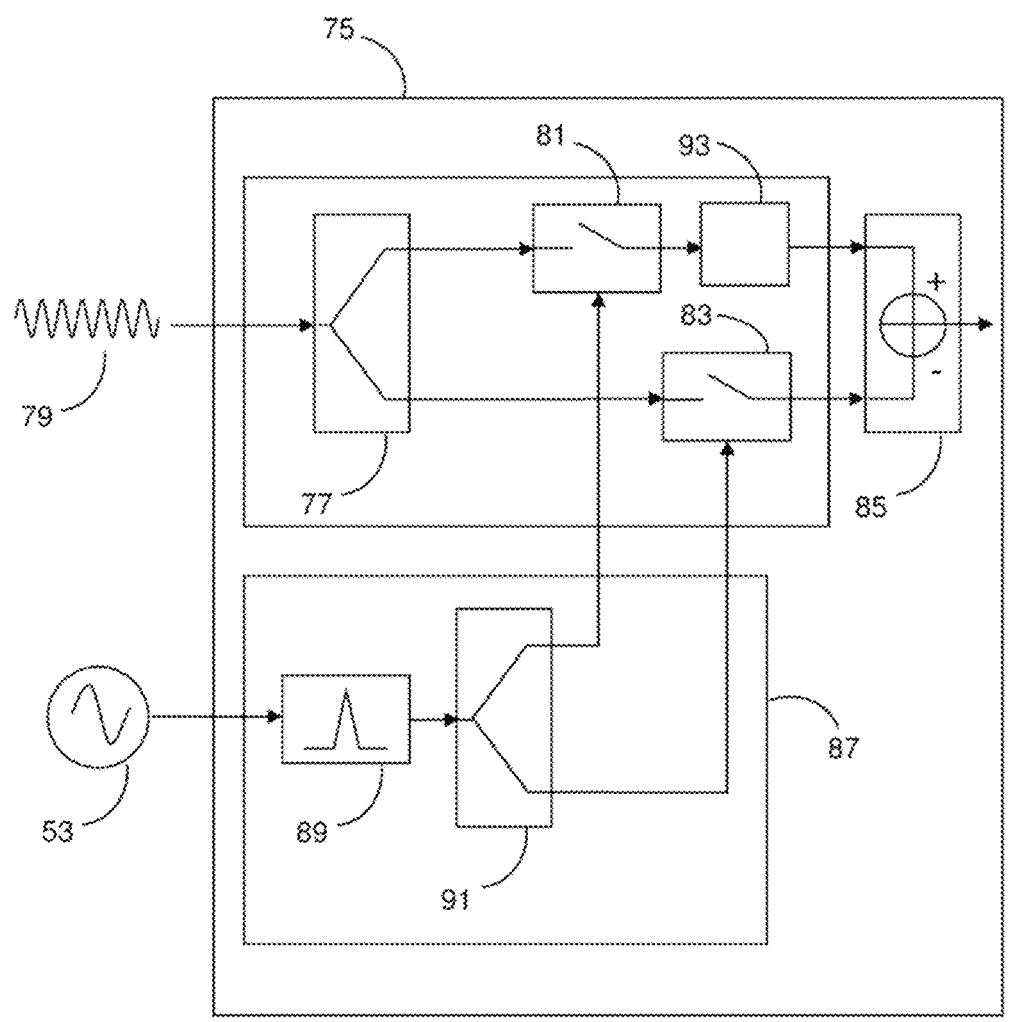
FIG. 27 shows a schematic of a sampling device according to a described embodiment.
Figure 28:
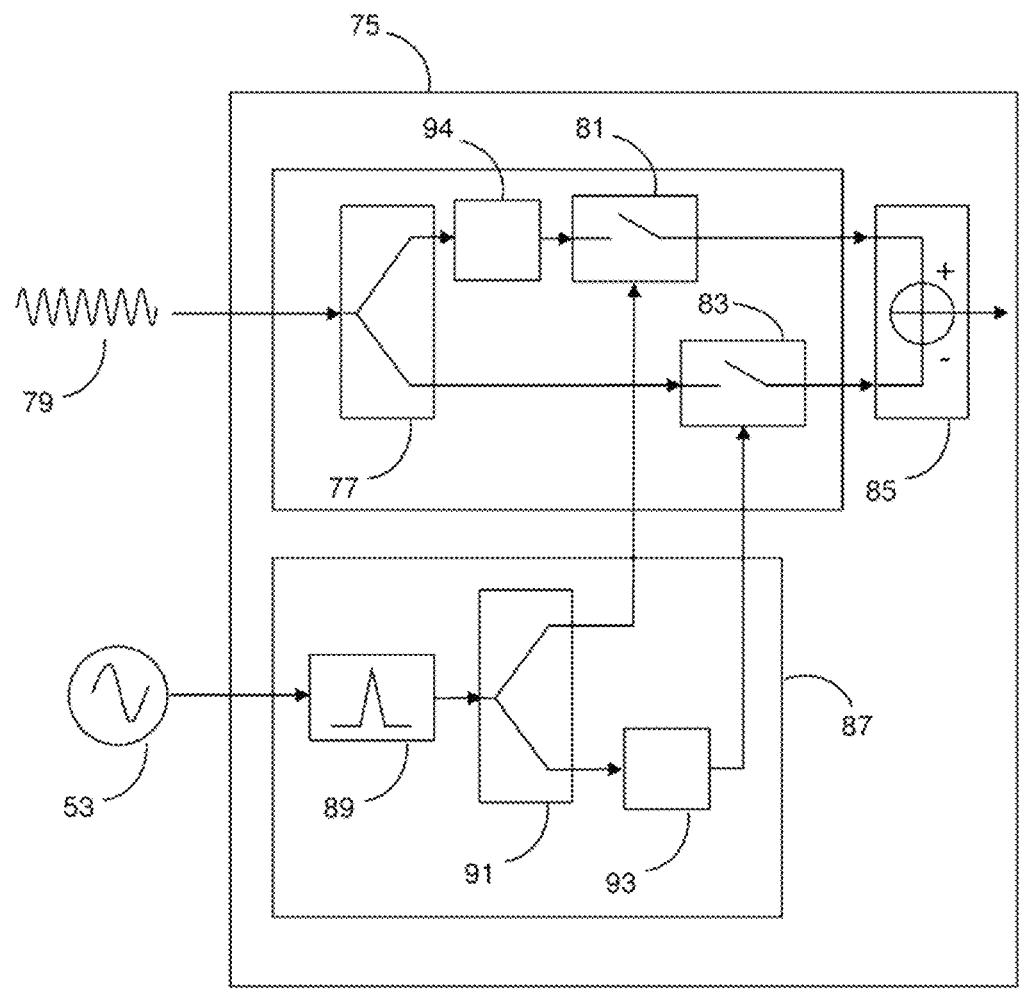
FIG. 28 shows a schematic of a sampling device according to a described embodiment.

In the case of up-conversion, in order to obtain a smooth gain profile, a single variable delay may be placed in one of the input paths after the sampling switch. An example is shown in FIG. 27 in which a single variable delay 93 is placed in the input signal path after switch 81. A smooth filtering effect may also be achieved for up-conversion using the arrangement shown in FIG. 28. Here, a variable delay 93 is used to delay the sampling pulse used to activate the switch 83 in one of the input signal paths. A second variable delay 94 is then placed before the switch 81 in the other input signal path.

The above discussion of FIGS. 23 to 28 applies to multi-channel embodiments, in which the input signal is split along multiple paths, each one having its own switch for sampling the signal. In single channel embodiments (i.e. ones in which only a single input path is provided, and in which all samples are obtained using the same single switch), it is only possible to delay the pulses used to activate the switch. As a result, if no further components are used to filter the signal, the gain profile for single channel embodiments will exhibit a stepped profile akin to that shown by the dashed line in FIG. 25.

Figure 29:
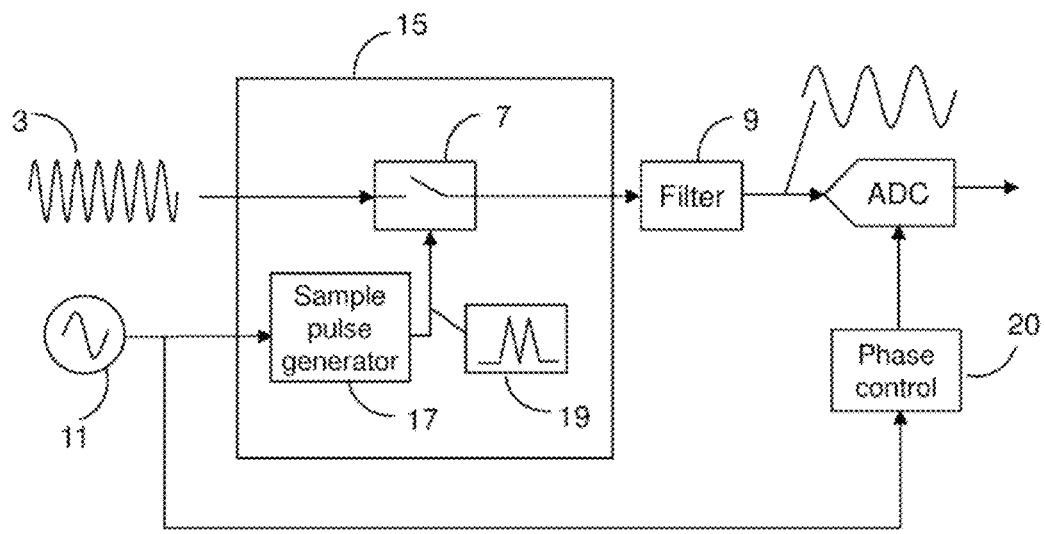
FIG. 29 shows a schematic of a sampling device according to a described embodiment.
Figure 30:
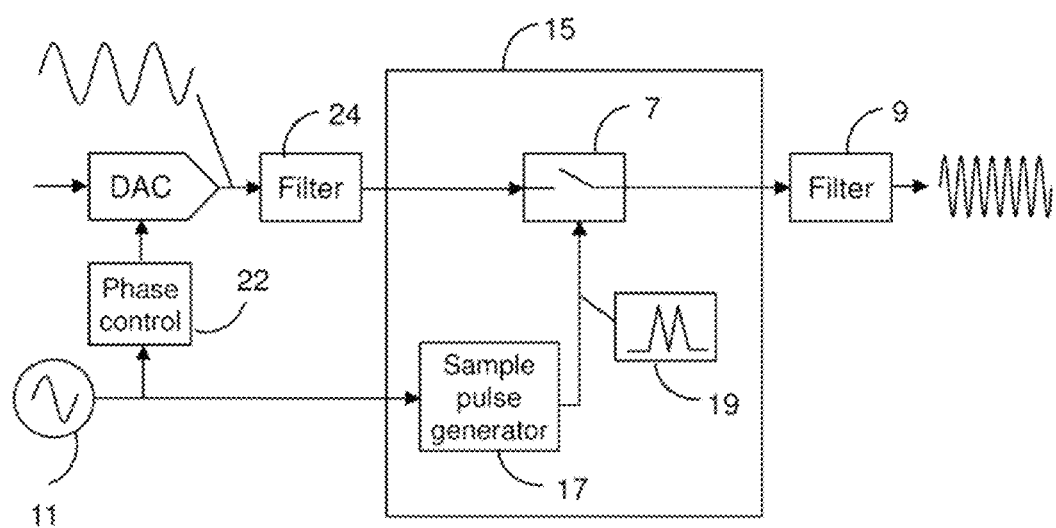
FIG. 30 shows a schematic of a sampling device according to a described embodiment.

For single channel embodiments, the gain profile can nonetheless be smoothed, akin to that shown in the solid line of FIG. 25, by suitable use of an ADC or DAC (depending on whether the sampling system is being used for down-conversion or up conversion, respectively). Examples of how this may be achieved in practice are provided in FIGS. 29 and 30. The embodiment shown in FIG. 29 is based on that shown in FIG. 3, but includes an additional phase control component 20 that is used to synchronise the ADC in phase and frequency with the clock signal input to the sample pulse generator. The filter 9 is, in this example, a low pass filter. Similarly, the embodiment shown in FIG. 30 is based on that shown in FIG. 4, but includes a phase control component 22 that serves to synchronise the DAC in phase and frequency with the clock signal input to the sample pulse generator. An additional low-pass filter 24 may be placed between the DAC and the sampler 15.

Figure 31:
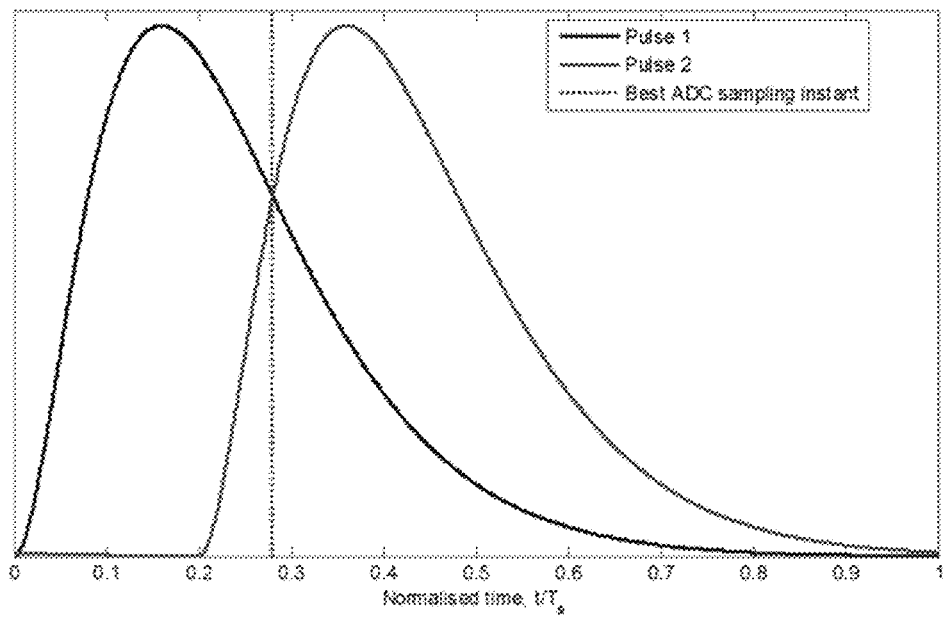
FIG. 31 shows an example of a signal output from a sampling device according to a described embodiment.

For down-conversion, the use of a low pass filter, together with phase synchronisation of the ADC can improve the system performance. The first stage of the ADC will usually include a sampler, which means there are effectively two samplers in the system (i.e. that of the sampling device, and that of the ADC itself). By tweaking the relative phases of each samplers clock, it is possible to increase the output power and provide a better balance between the weights of the different pulses. This principle can be understood by reference to FIG. 31, which shows an example of the signal output from a sampling device according to a described embodiment. In this example, the repeating sequence of pulses used to activate the sampler comprises a single pair of pulses, wherein the time interval between the pulses in the sequence is one fifth of that between successive clock pulses. As a consequence, the output signal too comprises a pair of pulses (Pulses 1 and 2 in FIG. 31). As a result of passing through the low-pass filter 9, the two output pulses are stretched in time. The filter response is chosen so that the different pulses are stretched enough to overlap one another. The ADC is synchronised in phase to sample the output signal at the point where the two pulses have the same amplitude.

Figure 32:
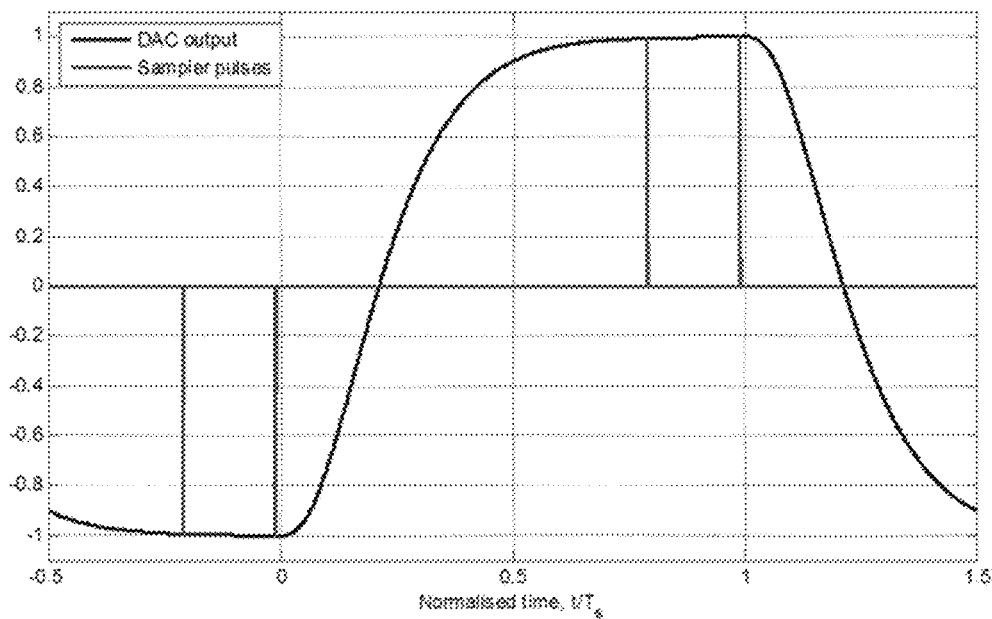
FIG. 32 shows an example of synchronising a DAC with a clock signal that is used to activate a sampling device in a described embodiment.

For up-conversion, it is desirable that all sample pulses in a particular sampling window (i.e. the interval between successive clock pulses) should see the same amplitude of signal output by the DAC. The phase synchronisation shown in FIG. 30 ensures that the sample pulses arrive at intervals where the output from the DAC is stabilised. FIG. 32 shows an example of this in practice. As in FIG. 31, the repeating sequence of pulses used to activate the sampler comprises a single pair of pulses, wherein the time interval between the pulses in the sequence is one fifth of that between successive clock pulses.

In practice phase synchronisation can be implemented by mechanical or electrical phase shifters. The relative phase of the ADC/DAC clock is adjusted to give the best performance.

Figure 33:
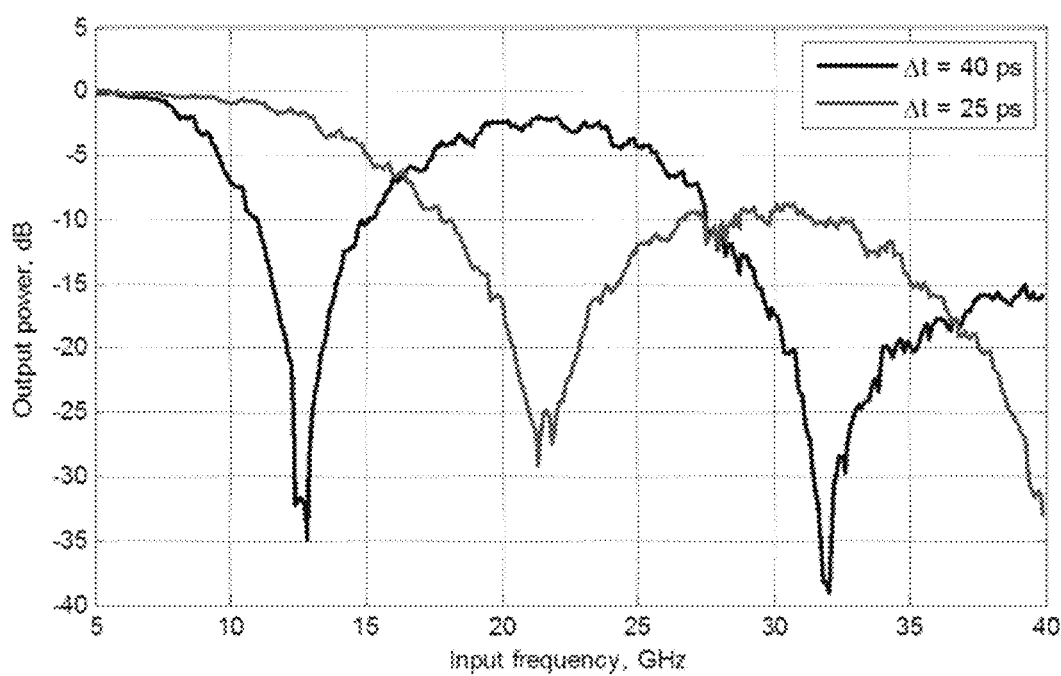
FIG. 33 shows the gain profile for different frequencies obtained when using a prototype sampling device based on the arrangement shown in FIG. 20.

As a proof of concept, an example embodiment was built based on the implementation shown in FIG. 20. The pulse width used in this prototype was of the order 15 ps. Two positive pulses were used, with the delay between the two pulses being adjustable. FIG. 33 shows the gain as a function of the input frequency for two different delays, of approximately 25 and 40 ps, respectively. A sampling frequency of 1.8 GS/s was used and the gain is normalised to 0 dB at 5 GHz. The results shown in FIG. 33 clearly demonstrate the filtering effect provided by embodiments described herein; with a pulse separation of 25 ps, minima are seen in the frequency spectrum at approximately 21.5 GHz and 40 GHz, with a maximum at approximately 30 GHz. By contrast, use of a pulse separation of 40 ps results in minima at 12.5 and 32 GHz, with maxima at 22 GHz and 40 GHz.

A sampling device according to embodiments described herein may be implemented in any system that has a clock pulse train. Many systems are based on this principle, for example, diode bridge samplers, mixer based samplers and photoconductive samplers (with an optic clock signal). Such samplers are particularly useful in the context of single channel embodiments. Other types of sampler, including sample-and-holds may be used for multi-channel embodiments.

The technique is compatible with many sampling systems, including optical and electrical samplers. The final system is relatively simple and avoids the need for expensive filters. Some implementations can even reduce the requirements on the pulse generator, which enables a cost saving on one of the most expensive parts of the system. Because of this simplicity, the system is small and only requires a low power. It is then a good candidate for onboard applications. The system is largely reconfigurable and can be adapted to various applications. In the case of a tunable filter, this is used to dynamically adapt the system to its environment.

While the invention has been described in conjunction with the exemplary embodiments described above, many equivalent modifications and variations will be apparent to those skilled in the art when given this disclosure. The targeted applications are Electronic Attack (EA) and Electronic Support Measures (ESM) systems but a wider range of applications can benefit from the technique described herein. Any application that uses a sub-Nyquist sampling technique can potentially use embodiments described herein. For example, embodiments described herein can be implemented in test equipment such as digital sampling oscilloscopes as well as multi-band receivers and emitters.

Accordingly, the exemplary embodiments set out above are considered to be illustrative and not limiting. Various changes to the described embodiments may be made without departing from the scope of the invention.

The invention claimed is:

1. A sampling device for sampling an incoming signal in order to generate an output signal having a different frequency spectrum from the incoming signal, the device comprising a sampler configured to sample the incoming signal at a series of intervals in time, wherein the series of intervals includes a temporally repeating sequence of intervals, and wherein a duration of successive intervals varies throughout the series.

2. The sampling device according to claim 1, comprising a sample pulse generator configured to generate a sampling signal comprising a plurality of sampling pulses for activating the sampler.

3. The sampling device according to claim 2, wherein the sampling device comprises a signal splitter for splitting the incoming signal into two or more signal paths, each path comprising a respective sampler for sampling the signal as it propagates along the respective path,
wherein at least one of the signal paths includes a variable delay for delaying the propagation of the signal along that path with respect to the other paths;
the device further including a signal combiner for combining the output of each sampler into a single output path.

4. The sampling device according to claim 3, wherein the variable delay is operable to delay the propagation of the sampled signal.

5. The sampling device according to claim 4, wherein the sample pulse generator includes an input for receiving a clock signal, the sample pulse generator being configured to output a sampling pulse for activating each sampler on receipt of a signal from the clock.

6. The sampling device according to claim 5, wherein the sample pulse generator comprises a variable delay for varying the delay between the sampling pulses that are output on receipt of a respective clock signal.

7. The sampling device according to claim 2, wherein the sampling signal is a stream of pulses comprising a repeating temporal sequence of pulses, and wherein the interval between successive sampling pulses varies throughout the stream.

8. The sampling device according to claim 7, wherein the sample pulse generator includes an input for receiving a clock signal, the sample pulse generator being configured to generate the sequence of pulses each time it receives a signal from the clock.

9. The sampling device according to claim 8, wherein the sample pulse generator comprises a local oscillator for generating the repeating sequence of pulses and a pulse generator for activating and deactivating the signal output by the local oscillator.

10. The sampling device according to claim 9, wherein the sample pulse generator further comprises a logic gate for receiving the output of the pulse generator and the local oscillator, the logic gate being configured to transmit the signal from the local oscillator to the sampler depending on whether the pulse generator output is above or below a threshold.

11. The sampling device according to claim 7, wherein the sample pulse generator comprises a variable delay for varying the interval between successive sampling pulses in the repeating sequence of pulses.

12. The sampling device according to claim 2, wherein the sample pulse generator comprises a pulse generator and a pulse repeater for replicating an initial pulse output by the pulse generator.

13. The sampling device according to claim 12, wherein the pulse repeater comprises a signal splitter for splitting the initial pulse output by the pulse generator into a plurality of pulses, each pulse being used to activate the sampler.

14. The sampling device according to claim 12, wherein the pulse repeater comprises a filter.

15. The sampling device according to claim 2, further comprising a digital to analogue converter for converting the input signal from a digital signal to an analogue signal.

16. The sampling device according to claim 15, comprising a phase shifter for synchronising the phase of the digital to analogue converter with a clock signal that is used to activate the sample pulse generator.

17. The sampling device according to claim 2, wherein the sample pulse generator is configured to generate sampling pulses at frequencies in excess of 1.0 GHz.

18. The sampling device according to claim 1, wherein the intervals are constant throughout the repeating sequence of intervals.

19. The sampling device according to claim 1 further comprising an analogue to digital converter for converting the output signal from an analogue signal to a digital signal.

20. The sampling device according to claim 19, comprising a phase shifter for synchronising the phase of the analogue to digital converter with a clock signal that is used to activate the sample pulse generator.

\* \* \* \* \*